United States Patent
Tian et al.

(10) Patent No.: US 12,490,612 B2
(45) Date of Patent: Dec. 2, 2025

(54) DISPLAY SUBSTRATE COMPRISING SIGNAL LINES AND SIGNAL ACCESS PINS AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Donghui Tian, Beijing (CN); Fan He, Beijing (CN); Cong Fan, Beijing (CN); Rong Wang, Beijing (CN); Mengmeng Du, Beijing (CN); Changlong Yuan, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/796,256

(22) PCT Filed: Sep. 9, 2021

(86) PCT No.: PCT/CN2021/117423
§ 371 (c)(1),
(2) Date: Jul. 28, 2022

(87) PCT Pub. No.: WO2023/035178
PCT Pub. Date: Mar. 16, 2023

(65) Prior Publication Data
US 2024/0188361 A1   Jun. 6, 2024

(51) Int. Cl.
*H10K 59/131* (2023.01)
*G09G 3/3266* (2016.01)

(52) U.S. Cl.
CPC ....... *H10K 59/1315* (2023.02); *G09G 3/3266* (2013.01); *G09G 2300/0852* (2013.01); *G09G 2310/08* (2013.01); *G09G 2330/06* (2013.01)

(58) Field of Classification Search
CPC ............. H10K 59/131; H10K 59/1315; H10D 86/441; G09G 3/3266; G09G 3/3275; G09G 2300/0408; G09G 2310/0286
(Continued)

(56) References Cited

U.S. PATENT DOCUMENTS

2008/0197778 A1* 8/2008 Kubota ............ H10K 59/80522
315/73
2018/0260061 A1* 9/2018 Hirota ............... G02F 1/133345
(Continued)

FOREIGN PATENT DOCUMENTS

| CN | 110867139 A | 3/2020 |
| CN | 111668264 A | 9/2020 |

(Continued)

OTHER PUBLICATIONS

European Search Report for 21956364.0 Mailed Jan. 22, 2024.

*Primary Examiner* — Didarul A Mazumder
(74) *Attorney, Agent, or Firm* — Ling Wu; Stephen Yang; Ling and Yang Intellectual Property

(57) ABSTRACT

Disclosed is a display substrate including a base substrate, at least one first signal line, and multiple signal access pins. The base substrate includes a display region and a peripheral region located at a periphery of the display region. The peripheral region includes a first peripheral region, a second peripheral region, a third peripheral region, and a fourth peripheral region which are communicated sequentially. The first signal line is located in the peripheral region and includes at least two sub-signal lines connected with each other. The multiple signal access pins are located in a signal access region. Each sub-signal line of the first signal line (Continued)

extends to the signal access region and is connected with at least one signal access pin in the signal access region so as to be connected with a driver chip through the signal access pin.

19 Claims, 11 Drawing Sheets

(58) Field of Classification Search
USPC .................................. 257/40; 438/82, 99
See application file for complete search history.

(56) References Cited

U.S. PATENT DOCUMENTS

2019/0006442 A1\* 1/2019 Byun ................... H10K 59/131
2020/0286965 A1  9/2020 Lim et al.

FOREIGN PATENT DOCUMENTS

| CN | 213241783 U | | 5/2021 | | |
|---|---|---|---|---|---|
| EP | 1610389 | \* | 12/2005 | ......... | G02F 1/13458 |
| EP | 1610389 A2 | \* | 12/2005 | ......... | G02F 1/13458 |

\* cited by examiner

DISPLAY SUBSTRATE COMPRISING SIGNAL LINES AND SIGNAL ACCESS PINS AND DISPLAY APPARATUS

CROSS-REFERENCE TO RELATED APPLICATION

The present application is a U.S. National Phase Entry of International Application No. PCT/CN2021/117423 having an international filing date of Sep. 9, 2021. The entire contents of the above-identified application are hereby incorporated by reference.

TECHNICAL FIELD

The present disclosure relates to, but is not limited to, the field of display technologies, and more particularly, to a display substrate and a display apparatus.

BACKGROUND

An Organic Light Emitting Diode (OLED) and a Quantum dot Light Emitting Diode (QLED) are active light emitting display devices, which have advantages of self-luminescence, a wide viewing angle, a high contrast ratio, low power consumption, an extremely high response speed, lightness and thinness, bendability, and a low cost, etc.

SUMMARY

The following is a summary of subject matters described herein in detail. The summary is not intended to limit the protection scope of claims.

At least one embodiment of the present disclosure provides a display substrate and a display apparatus.

In one aspect, an embodiment of the present disclosure provides a display substrate, which includes a base substrate, at least one first signal line, and multiple signal access pins. The base substrate includes a display region and a peripheral region located at a periphery of the display region. The peripheral region includes a first peripheral region, a second peripheral region, a third peripheral region, and a fourth peripheral region which are communicated sequentially; the first peripheral region and the third peripheral region are located on two opposite sides of the display region along a first direction, and the second peripheral region and the fourth peripheral region are located on two opposite sides of the display region along a second direction, the first direction intersecting the second direction. The at least one first signal line is located in the peripheral region and includes at least two sub-signal lines connected with each other. At least one sub-signal line of the first signal line is located in the first peripheral region, and another at least one sub-signal line of the first signal line is located in the third peripheral region. The multiple signal access pins are located in a signal access region. The signal access region is located in the fourth peripheral region, or in the fourth peripheral region and the second peripheral region. Each sub-signal line of the first signal line extends to the signal access region and is connected with at least one signal access pin in the signal access region so as to be connected with a driver chip through the signal access pin.

In some exemplary implementation modes, multiple first signal lines are provided in the peripheral region and the multiple first signal lines include at least one clock signal line and at least one initial signal line.

In some exemplary implementation modes, a line width of the clock signal line is about 15 microns to 25 microns, and a line width of the initial signal line is about 15 microns to 25 microns.

In some exemplary implementation modes, the first signal line is in a shape of an arc in a communicated region of two adjacent peripheral regions.

In some exemplary implementation modes, the at least two sub-signal lines of the first signal line are connected with different driver chips.

In some exemplary implementation modes, the at least two sub-signal lines of the first signal line are of an integral structure.

In some exemplary implementation modes, at least one sub-signal line of the first signal line includes a first wiring and a second wiring connected with each other; the second wiring is located on one side of the first wiring away from the base substrate, and an orthographic projection of the second wiring on the base substrate is overlapped with an orthographic projection of the first wiring on the base substrate.

In some exemplary implementation modes, the first wiring is in direct contact with the second wiring; or an insulation layer is disposed between the first wiring and the second wiring, and the second wiring is connected with the first wiring through a via provided on the insulation layer.

In some exemplary implementation modes, the display substrate further includes at least one connection line located in the peripheral region. The two sub-signal lines of the first signal line are connected through the connection line; or at least one sub-signal line of the first signal line includes at least two signal line segments, and adjacent signal line segments are connected through the connection line. The connection line is located on one side of the first signal line close to the base substrate.

In some exemplary implementation modes, the first peripheral region and the third peripheral region are provided with gate drive circuits. The connection line is located in the second peripheral region; or the first peripheral region and the third peripheral region each include at least one first sub-region and at least one second sub-region, wherein both the first sub-region and the second sub-region are adjacent to the display region, the first sub-region and the second sub-region are communicated, and a gate drive circuit is located in the first sub-region; the connection line is located in the second sub-region.

In some exemplary implementation modes, an insulation layer is provided between the connection line and the first signal line, and the connection line is connected with the first signal line through a via provided on the insulation layer.

In some exemplary implementation modes, in a plane perpendicular to the display substrate, the display substrate includes a semiconductor layer, a first conductive layer, a second conductive layer, a third conductive layer, and a fourth conductive layer that are disposed on the base substrate. The connection line is located on the first conductive layer or the second conductive layer.

In some exemplary implementation modes, a length of the connection line in an extension direction is about 50 microns to 500 microns.

In some exemplary implementation modes, multiple connection lines are provided in the peripheral region, and lengths of the multiple connection lines are approximately the same, or gradually increase along a direction away from the display region.

In some exemplary implementation modes, the first peripheral region and the third peripheral region are provided with gate drive circuits connected with the first signal line. A gate drive circuit includes multiple drivers, the multiple drivers are arranged sequentially along a direction away from the display region, and at least one driver includes multiple cascaded sub-drive circuits.

In some exemplary implementation modes, a sub-drive circuit at least includes a first output transistor and a second output transistor, and a ratio of width to length of the second output transistor is greater than a ratio of width to length of the first output transistor.

In some exemplary implementation modes, a width of a conductive channel of the second output transistor is approximately twice a width of a conductive channel of the first output transistor.

In some exemplary implementation modes, the sub-drive circuit is connected with a first power line and a second power line; and the first power line and the second power line are of a single-layer wiring structure.

In some exemplary implementation modes, the sub-drive circuit further includes a first storage capacitor. The first storage capacitor is connected with the first output transistor and the first power line; the first storage capacitor is located between the second power line and the first output transistor.

In some exemplary implementation modes, the first signal line is further electrically connected with an electrostatic discharge unit, and at a position where the first signal line is connected with the electrostatic discharge unit, the first signal line is of a single-layer wiring structure or a double-layer wiring structure.

In another aspect, an embodiment of the present disclosure further provides a display apparatus including the display substrate described above.

After drawings and detailed description are read and understood, other aspects may become apparent.

BRIEF DESCRIPTION OF DRAWINGS

The drawings are intended to provide a further understanding of technical solutions of the present disclosure and constitute a part of the specification, and are used for explaining the technical solutions of the present disclosure together with embodiments of the present disclosure, and not intended to constitute a limitation to the technical solutions of the present disclosure. A shape and a size of one or more components in the drawings do not reflect true proportions, and are only intended to schematically illustrate contents of the present disclosure.

DETAILED DESCRIPTION

Figure 1:
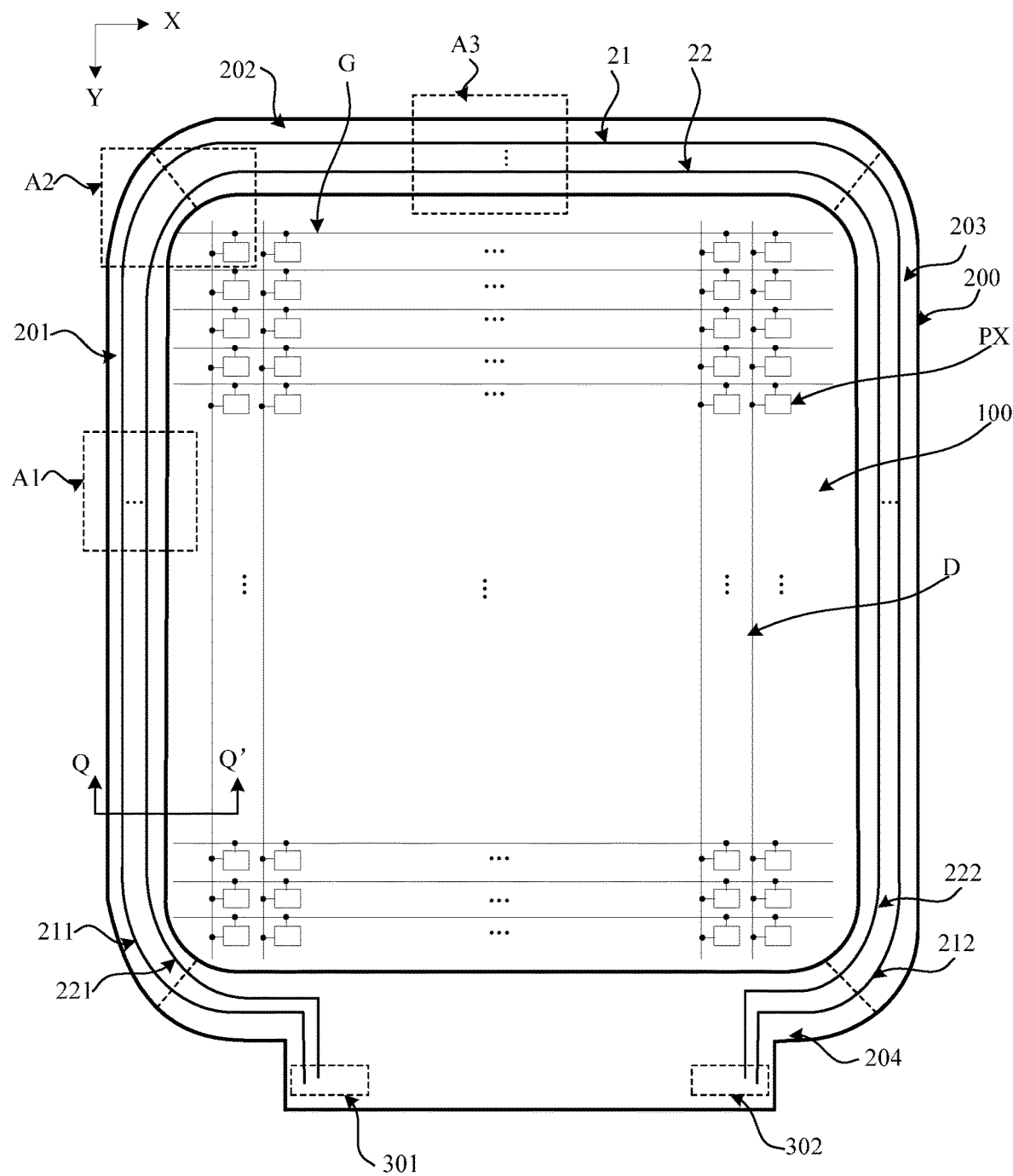
FIG. 1 is a schematic diagram of a display substrate according to at least one embodiment of the present disclosure.

The embodiments of the present disclosure will be described below with reference to the drawings. Implementation modes may be implemented in multiple different forms. Those of ordinary skills in the art may readily understand a fact that modes and contents thereof may be transformed into different forms without departing from the purpose and scope of the present disclosure. Therefore, the present disclosure should not be interpreted as being limited to the contents recorded in following implementation modes only. The embodiments in the present disclosure and features in the embodiments may be arbitrarily combined with each other without conflict.

Sometimes for the sake of clarity, a size of one or more constituent elements, a thickness of a layer, or a region in the drawings may be exaggerated. Therefore, one mode of the present disclosure is not necessarily limited to the size, and a shape and a size of one or more component in the drawings do not reflect true proportions. In addition, the drawings schematically illustrate ideal examples, and one mode of the present disclosure is not limited to shapes or numerical values shown in the drawings.

Ordinal numerals such as "first", "second", "third" and the like in the specification are set to avoid confusion of the constituent elements, but not to set a limit in quantity. "Multiple" in the present disclosure may refer to two or more than two.

For convenience, wordings such as "middle", "upper", "lower", "front", "back", "vertical", "horizontal", "top", "bottom", "inside", "outside", and the like indicating orientation or positional relationships are used in the specification to illustrate positional relationships between the constituent elements with reference to the drawings, and are only for convenience of describing the specification and simplifying the description, but not to indicate or imply that device referred apparatus or element must have a specific orientation and be constructed and operated in the specific orientation, therefore, they should not be understood as limitations to the present disclosure. The positional relationships between the constituent elements are appropriately changed according to a direction in which the constituent elements are described. Therefore, wordings described in the specification are not limited and may be appropriately replaced according to a situation.

Unless otherwise specified and defined explicitly, terms "installed", "coupled", and "connected" should be understood in a broad sense in the specification. For example, a connection may be a fixed connection, a detachable connection, or an integral connection, or may be a mechanical connection or an electrical connection, or may be a direct connection, an indirect connection through intermediate components, or communication inside two elements. For those skilled in the art, meanings of the above terms in the present disclosure may be understood according to a situation.

In the specification, a transistor refers to an element which at least includes three terminals: a gate (gate electrode), a drain, and a source. The transistor has a channel region between the drain (drain electrode terminal, drain region, or drain electrode) and the source (source electrode terminal, source region, or source electrode), and a current can flow through the drain, the channel region and the source. In the specification, the channel region refers to a region through which the current mainly flows.

In the specification, a first electrode may be a drain, and a second electrode may be a source, or the first electrode may be a source, and the second may be a drain electrode. In addition, the gate may be also referred to as a control electrode. In a case that transistors with opposite polarities are used or that a direction of a current is changed during circuit operation, functions of the "source" and the "drain" may sometimes be exchanged. Therefore, the "source" and the "drain" may be exchanged in the specification.

In the specification, an "electrical connection" includes a case in which the constituent elements are connected together through an element with some electrical action. The "element with some electrical action" is not particularly limited as long as electric signals between the connected constituent elements may be sent and received. Examples of the "element with some electrical action" include not only an electrode and a wiring, but also a switch element such as a transistor, a resistor, an inductor, a capacitor, other elements with various functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 80° and less than 100°, and thus also includes a state in which the angle is greater than 85° and less than 95°.

"About" and "approximately" in the present disclosure refer to that a boundary is not defined strictly and numerical values within process and measurement error ranges are allowed.

At least one embodiment of the present disclosure provides a display substrate, which includes a base substrate, at least one first signal line, and multiple signal access pins. The base substrate includes a display region and a peripheral region located at a periphery of the display region. The peripheral region includes a first peripheral region, a second peripheral region, a third peripheral region, and a fourth peripheral region which are communicated sequentially; the first peripheral region and the third peripheral region are located on two opposite sides of the display region along a first direction, and the second peripheral region and the fourth peripheral region are located on two opposite sides of the display region along a second direction. The first direction intersects the second direction, for example, the first direction is perpendicular to the second direction. The at least one first signal line is located in the peripheral region and the first signal line includes at least two sub-signal lines connected with each other. At least one sub-signal line of the first signal line is located in the first peripheral region, and another at least one sub-signal line of the first signal line is located in the third peripheral region. The multiple signal access pins are located in a signal access region. The signal access region is located in the fourth peripheral region, or in the fourth peripheral region and the second peripheral region. Each sub-signal line of the first signal line extends to the signal access region and is connected with at least one signal access pin in the signal access region, so as to be connected with a driver chip through the signal access pin.

In the display substrate provided by this embodiment, by connecting sub-signal lines connected with different signal access pins in the peripheral region, it may be ensured that the first signal line provides a consistent output signal, thereby avoiding abnormal display.

In some exemplary implementation modes, multiple first signal lines are provided in the peripheral region, and the multiple first signal lines includes at least one clock signal line and at least one initial signal line. However, this embodiment is not limited thereto.

In some exemplary implementation modes, a line width of the clock signal line is about 15 microns to 25 microns, and a line width of the initial signal line is about 15 microns to 25 microns. For example, the line width of the clock signal line may be about 15 microns, 18 microns, 20 microns, or 23 microns. The line width of the initial signal line may be about 15 microns, 18 microns, 20 microns, or 23 microns. However, this embodiment is not limited thereto.

In some exemplary implementation modes, the first signal line is in a shape of an arc in a communicated region of two adjacent peripheral regions. However, this embodiment is not limited thereto.

In some exemplary implementation modes, the at least two sub-signal lines of the first signal line are connected with different driver chips. However, this embodiment is not limited thereto. For example, the at least two sub-signal lines of the first signal line may be connected with a same driver chip.

In some exemplary implementation modes, the at least two sub-signal lines of the first signal line may be an integral structure. Or, the at least two sub-signal lines of the first signal line may be connected through a connection line. However, this embodiment is not limited thereto.

In some exemplary implementation modes, the display substrate of this embodiment may be a display substrate with a medium or large size. For example, a resolution of the display substrate may be at least one of: 2560×1440, 3840×2160, and 7680×4320. However, this embodiment is not limited thereto.

In some exemplary implementation modes, at least one of the sub-signal lines of the first signal line includes a first wiring and a second wiring connected with each other. The second wiring is located on one side of the first wiring away from the base substrate, and an orthographic projection of the second wiring on the base substrate is overlapped with an orthographic projection of the first wiring on the base substrate. In some examples, the orthographic projection of the second wiring on the base substrate may coincide with the orthographic projection of the first wiring on the base substrate. In some examples, a double-layer wiring is used for all multiple sub-signal lines included by the first signal line, or a double-layer wiring is used for at least one of the sub-signal lines. However, this embodiment is not limited thereto. In this exemplary embodiment, a multi-layer wiring is used for the first signal line, so that a resistance may be reduced, thereby improving a signal transmission capability.

In some exemplary implementation modes, the first wiring is in direct contact with the second wiring. Or, an insulation layer is disposed between the first wiring and the second wiring, and the second wiring is connected with the first wiring through multiple vias provided on the insulation layer. However, this embodiment is not limited thereto.

In some exemplary implementation modes, adjacent sub-signal lines of the first signal line may be connected through a connection line. Or, at least one of the sub-signal lines of the first signal line may include at least two signal line segments, and adjacent signal line segments may be connected through a connection line. The connection line may be located on one side of the first signal line close to the base substrate. In some examples, adjacent sub-signal lines of the first signal line may be connected through a connection line, and signal line segments of the sub-signal lines are also connected through a connection line. However, this embodiment is not limited thereto. In this exemplary implementation mode, sub-signal lines or signal line segments of the first signal line are connected through a connection line, which may avoid occurrence of static electricity accumulation due to an excessively long first signal line in a production process of the display substrate.

In some exemplary implementation modes, an insulation layer is provided between the connection line and the first signal line, and the connection line is connected with the first signal line through a via provided on the insulation layer.

In some exemplary implementation modes, gate drive circuits are provided in the first peripheral region and the third peripheral region. The connection line is located in the second peripheral region; or the first peripheral region and the third peripheral region each include at least one first sub-region and at least one second sub-region. Both the first sub-region and the second sub-region are adjacent to the display region, the first sub-region and the second sub-region are communicated, a gate drive circuit is located in the first sub-region, and the connection line is located in the second sub-region. In this example, the connection line is not provided in the first sub-region and is not directly connected with the gate drive circuit, so as to avoid affecting working stability of the gate drive circuit.

In some exemplary implementation modes, the gate drive circuit includes multiple drivers. The multiple drivers are sequentially arranged along a direction away from the display region. At least one driver includes multiple cascaded sub-drive circuits. In some examples, a sub-drive circuit may be a circuit with an 8T2C structure. However, this embodiment is not limited thereto.

In some exemplary implementation modes, multiple first signal lines are provided in the peripheral region, and the multiple first signal lines include multiple groups of first signal lines. A group of first signal lines are connected with one driver. Each group of first signal lines may be located on one side of the driver, with which they are connected, away from the display region. However, this embodiment is not limited thereto. For example, each group of first signal lines may be located on an upper side of the driver with which they are connected, or on one side of the driver, with which they are connected, close to the display region. In some examples, each group of first signal lines may include an initial signal line and at least one clock signal line.

In some exemplary implementation modes, the first signal line is also electrically connected with an electrostatic discharge unit, and at a position where the first signal line is connected with the electrostatic discharge unit, the first signal line is of a single-layer wiring structure or a double-layer wiring structure. However, this embodiment is not limited thereto.

Solutions of this embodiment will be described below through multiple examples.

FIG. 1 is a schematic diagram of a display substrate according to at least one embodiment of the present disclosure. In some exemplary implementation modes, as shown in FIG. 1, the display substrate provided by this exemplary embodiment includes a base substrate. The base substrate includes a display region 100 and a peripheral region 200 located at a periphery of the display region 100. The peripheral region 200 includes: a first peripheral region 201, a second peripheral region 202, a third peripheral region 203, and a fourth peripheral region 204 that are communicated sequentially. The first peripheral region 201 and the third peripheral region 203 are located on two opposite sides of the display region 100 along a first direction X. The second peripheral region 202 and the fourth peripheral region 204 are located on two opposite sides of the display region 100 along a second direction Y. In some examples, the fourth peripheral region 204 includes a first signal access region 301 and a second signal access region 302 that are located on a same side of the display region 100. For example, the first signal access region 301 and the second signal access region 302 are located on one side of the display region 100 in the second direction Y, and the first signal access region 301 and the second signal access region 302 are arranged sequentially in the first direction X. However, this embodiment is not limited thereto. In some examples, the fourth peripheral region 204 may include more than two signal access regions.

In some exemplary implementation modes, the display substrate may be in an approximately rectangular shape. As shown in FIG. 1, the display substrate may include a pair of short sides that are parallel to each other in the first direction X and a pair of long sides that are parallel to each other in the second direction Y. That is, a length of the display substrate in the first direction X is less than a length of the display substrate in the second direction Y. The first direction X intersects the second direction Y, for example, the first direction X is perpendicular to the second direction Y. In this example, the first signal access region 301 and the second signal access region 302 are located on one side of a short side of the base substrate. However, a shape of the base substrate is not limited in this embodiment.

In some exemplary implementation modes, the base substrate may be in a shape of a closed polygon including linear sides, a circle or ellipse including a curved side, or a semi-circle or semi-ellipse including a linear side and a curved side, or the like. In some examples, when the base substrate has a linear side, at least some corners of the base substrate may be curved. When the base substrate is in a shape of a rectangle, a portion at a position where adjacent linear sides intersect each other may be replaced by a curve with a predetermined curvature. Among them, the curvature may be set according to different positions of the curve. For example, the curvature may be changed according to a starting position of the curve, a length of the curve, etc.

In some exemplary implementation modes, as shown in FIG. 1, the display region 100 at least includes multiple sub-pixels PX, multiple gate lines G, and multiple data lines D. The multiple gate lines G extend along the first direction X and are arranged along the second direction Y sequentially. The multiple data lines D extend along the second direction Y and are arranged along the first direction X sequentially. Orthographic projections of the multiple gate lines G on the base substrate intersect orthographic projections of the multiple data lines D on the base substrate to form multiple sub-pixel regions, and one sub-pixel PX is arranged in each sub-pixel region. The multiple data lines D are electrically connected with multiple sub-pixels PX and are configured to provide data signals to the multiple sub-pixels PX. The multiple gate lines G are electrically connected with the multiple sub-pixels PX and are configured to provide gate control signals to the multiple sub-pixels PX. In some examples, multiple gate lines may include multiple scan lines, multiple emission lines, and multiple reset lines. For example, the scan lines may provide scan signals to the multiple sub-pixels PX, the emission lines may provide emission signals to the multiple sub-pixels PX, and the reset lines may provide reset signals to the multiple sub-pixels PX. However, this embodiment is not limited thereto.

In some exemplary implementation modes, one pixel unit may include three sub-pixels, which may be a red sub-pixel, a green sub-pixel, and a blue sub-pixel respectively. However, this embodiment is not limited thereto. In some examples, one pixel unit may include four sub-pixels, which may be a red sub-pixel, a green sub-pixel, a blue sub-pixel, and a white sub-pixel respectively.

In some exemplary implementation modes, a shape of a sub-pixel may be a rectangle, a rhombus, a pentagon, or a hexagon. When a pixel unit includes three sub-pixels, the three sub-pixels may be arranged side by side horizontally, side by side vertically, or in a shape of a Chinese character "品". When a pixel unit includes four sub-pixels, the four sub-pixels may be arranged side by side horizontally, side by side vertically, or in a shape of a square. However, this embodiment is not limited thereto.

In some exemplary implementation modes, a sub-pixel may include a pixel circuit and a light emitting element electrically connected with the pixel circuit. The pixel circuit may include multiple transistors and at least one capacitor. For example, the pixel circuit may be of a 3T1C (three transistors and one capacitor) structure, a 7T1C (seven transistors and one capacitor) structure, or a 5T1C (five transistors and one capacitor) structure. In some examples, the light emitting element may be an OLED device. The light emitting element may include a first electrode, a second electrode, and an organic emitting layer located between the first electrode and the second electrode. The first electrode of the light emitting element may be electrically connected with a corresponding pixel circuit. However, this embodiment is not limited thereto.

Figure 2:
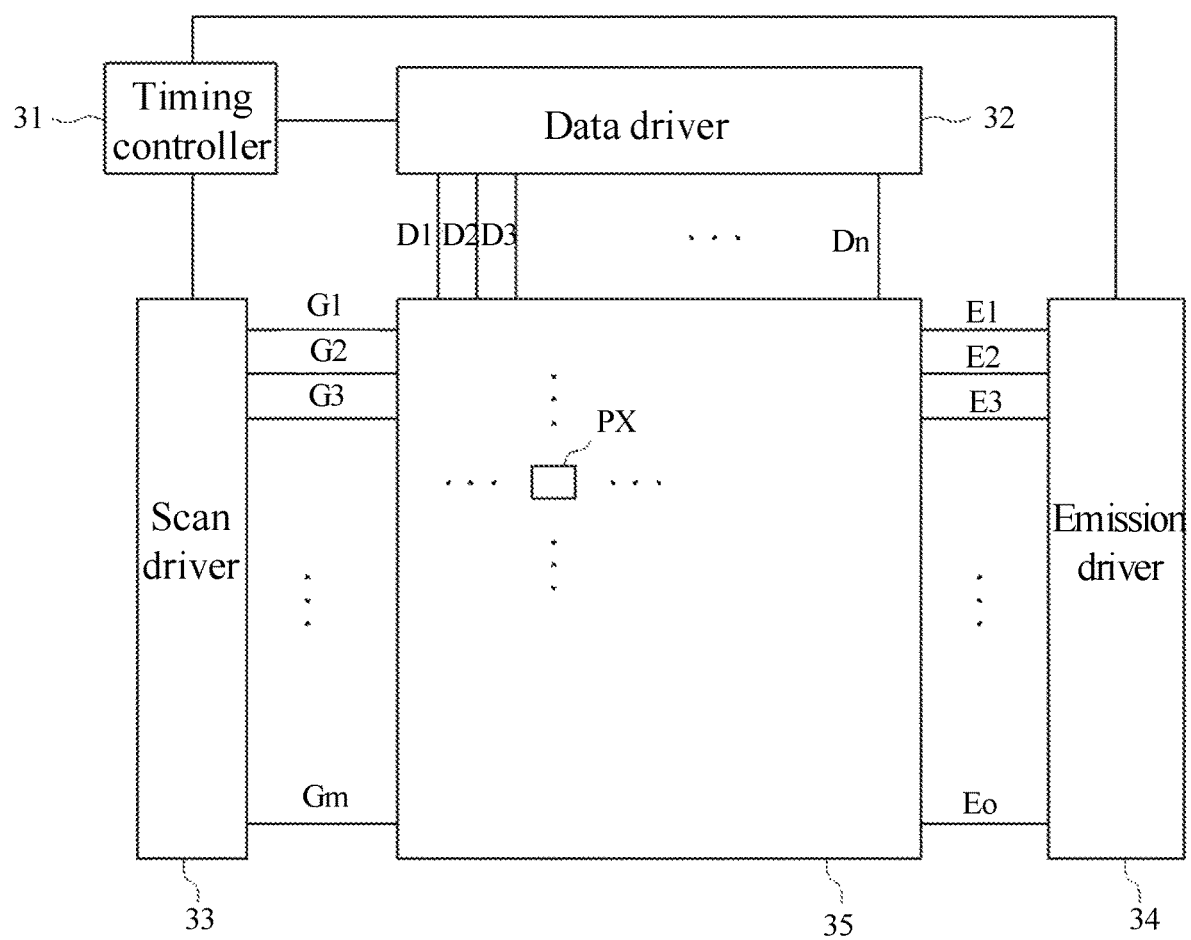
FIG. 2 is a schematic diagram of a structure of a display substrate according to at least one embodiment of the present disclosure.

FIG. 2 is a schematic diagram of a structure of a display substrate according to at least one embodiment of the present disclosure. In some exemplary implementation modes, as shown in FIG. 2, the display substrate may include a timing controller 31, a data driver 32, a gate drive circuit, and a sub-pixel array 35. The gate drive circuit may include multiple drivers, for example, a scan driver 33 and an emission driver 34. The sub-pixel array 35 located in the display region 100 includes multiple sub-pixels PX arranged regularly. The scan driver 33 is configured to provide a scan signal to a sub-pixel PX along a scan line; the data driver 32 is configured to provide a data signal to a sub-pixel PX along a data line; the emission driver 34 is configured to provide an emission signal to a sub-pixel PX along an emission line; the timing controller 31 is configured to control the scan driver 33, the emission driver 34, and the data driver 32.

In some exemplary implementation modes, the timing controller 31 may provide a gray-scale value and a control signal adaptable to a specification of the data driver 32 to the data driver 32; the timing controller 31 may provide a clock signal and an initial signal adaptable to a specification of the scan driver 33 to the scan driver 33; the timing controller 31 may provide a clock signal and an initial signal adaptable to a specification of the emission driver 34 to the emission driver 34. The data driver 32 may generate a data voltage, which will be provided to data lines D1 to Dn, using the gray-scale value and the control signal received from the timing controller 31. For example, the data driver 32 may sample the gray-scale value using a clock signal and apply a data signal corresponding to the gray-scale value on the data lines D1 to Dn by taking a row of sub-pixels as a unit. The scan driver 33 may generate a scan signal, which will be provided to scan lines G1 to Sm, through the clock signal and the initial signal received from the timing controller 31. For example, the scan driver 33 may sequentially provide a scan signal with a turn-on level pulse to a scan line. In some examples, the scan driver 33 may include a shift register and may generate a scan signal by sequentially transmitting a scan initial signal provided in a form of a turn-on level pulse to a next-stage circuit under control of a clock signal. The emission driver 34 may generate an emission signal, which will be provided to emission lines E1 to Eo, through the clock signal and the initial signal received from the timing controller 31. For example, the emission driver 34 may sequentially provide an emission signal with a cut-off level pulse to an emission line. The emission driver 34 may include a shift register, so as to generate an emission signal by sequentially transmitting an emission initial signal provided in a form of a cut-off level pulse to a next-stage circuit under control of a clock signal. Among them, n, m, and o are all natural numbers.

In some exemplary implementation modes, the gate drive circuit may be directly disposed on the base substrate. For example, multiple drivers may be disposed in the peripheral region (e.g., the first peripheral region and the third peripheral region) on left and right sides of the display region. In some examples, the multiple drivers may be formed together with a sub-pixel in a process of forming the sub-pixel. However, positions of the multiple drivers or a manner in which the multiple drivers is formed are not limited in this embodiment. In some examples, the multiple drivers may be disposed on a separate chip or printed circuit board so as to be connected with a bonding pad or welding gasket formed on the base substrate.

In some exemplary implementation modes, the data driver 32 may be disposed on a separate chip or printed circuit board so as to be connected with a sub-pixel through a signal access pin provided in a signal access region of the base substrate. For example, the data driver 32 may be formed and disposed in the signal access region using a chip on glass, a chip on plastic, a chip on film, etc., so as to be connected with the signal access pin on the base substrate. The timing controller 31 may be provided separately from or provided integrally with the data driver 32. However, this embodiment is not limited thereto.

In some exemplary implementation modes, as shown in FIG. 1, the first signal access region 301 is provided with multiple signal access pins so as to be connected with a first driver chip. The second signal access region 302 is provided with multiple signal access pins so as to be connected with a second driver chip. In some examples, the first driver chip and the second driver chip are respectively integrated with data drivers. For example, the first driver chip may provide data signals to sub-pixels PX in a left half region of the display region 100 and provide an initial signal and a clock signal to a gate drive circuit located at a left bezel; the second driver chip may provide data signals to sub-pixels PX in a right half region of the display region 100 and provide an initial signal and a clock signal to a gate drive circuit located at a right bezel. In some examples, when the fourth peripheral region 204 includes multiple signal access regions, multiple driver chips may be disposed in the fourth peripheral region 204. Compared with providing driver chips on a long side of the display substrate, in this exemplary embodiment, a quantity of required driver chips may be reduced by providing driver chips on a short side of the display substrate, thereby decreasing a product cost. However, this embodiment is not limited thereto. For example, the fourth peripheral region 204 may be provided with one driver chip.

In some implementation modes, different driver chips provide initial signals and clock signals to gate drive circuits on both sides of the display region respectively. A case that initial signals and clock signals output by different driver chips are not synchronized and factors such as a fact that wirings in the peripheral region on left and right sides of the display substrate cannot be exactly the same, will lead to a case that gate control signals output by gate drive circuits on the left and right sides of the display region to sub-pixels of the display region are not synchronized, thereby resulting in abnormal display. In other implementation modes, a driver chip is provided in a signal access region located in the fourth peripheral region, and the driver chip provides initial signals and clock signals to gate drive circuits on both sides of the display region. Uneven process or uneven material tends to lead to a case that signals output by the driver chip to both sides of the display region cannot be completely consistent, which lead to a case that gate control signals output by gate drive circuits on left and right sides of the display region to sub-pixels of the display region are not synchronized, thereby resulting in abnormal display.

Figure 3:
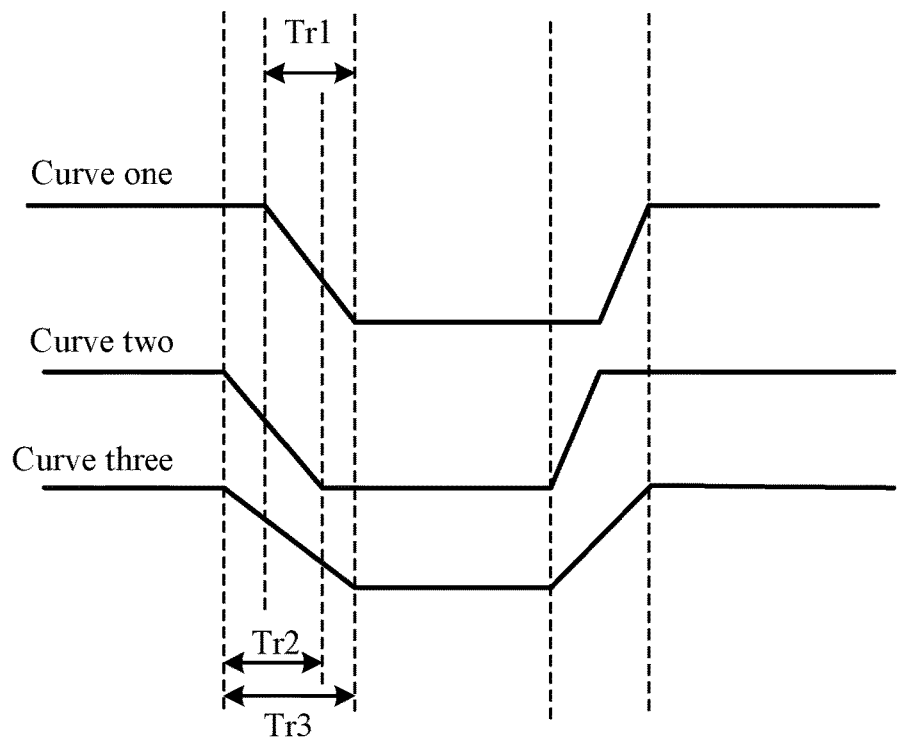
FIG. 3 is a schematic diagram illustrating that gate control signals output by gate drive circuits on left and right sides of a display region are not synchronized.

FIG. 3 is a schematic diagram illustrating that gate control signals output by gate drive circuits on left and right sides of a display region are not synchronized. As shown in FIG. 3, Curve one represents a gate control signal outputted by a gate drive circuit located at a left bezel of the display substrate, Curve two represents a gate control signal outputted by a gate drive circuit located at a right bezel of the display substrate, and Curve three represents a gate control signal received by a sub-pixel in a middle region of the display substrate. Curve three represents a gate control signal obtained after Curve one and Curve two are superimposed. Durations of rising edges and falling edges of gate control signals shown by Curve one and Curve two are the same, whereas durations of a falling edge and a rising edge of the gate control signal shown by Curve three are increased. For example, a duration of a falling edge of a gate control signal shown by Curve one is Tr1, a duration of a falling edge of a gate control signal shown by Curve two is Tr2, and a duration of the falling edge of the gate control signal shown by Curve three is Tr3, wherein Tr1 is the same as Tr2 and less than Tr3. It may be seen that writing time of a data signal becomes shorter in the middle region of the display region, resulting in that the data signal cannot be completely written into sub-pixels of the middle region, thus abnormal display is prone to occur.

In some exemplary implementation modes, as shown in FIG. 1, the display substrate of this embodiment includes multiple first signal lines located in the peripheral region 200. The multiple first signal lines may include multiple initial signal lines 21 (only one of which is illustrated in FIG. 1) and multiple clock signal lines 22 (only one of which is illustrated in FIG. 1). The clock signal lines 22 may be located on one side of the initial signal lines 21 close to the display region 100. For example, an initial signal line 21 includes a first sub-initial signal line 211 and a second sub-initial signal line 212 connected with each other. The first sub-initial signal line 211 is located in the first peripheral region 201 and extends to the first signal access region 301 of the fourth peripheral region 204, and is connected with a signal access pin in the first signal access region 301 so as to be connected with the first driver chip through the signal access pin. The second sub-initial signal line 212 is located in the third peripheral region 203 and extends to the second signal access region 302 of the fourth peripheral region 204, and is connected with a signal access pin in the second signal access region 302 so as to be connected with the second driver chip through the signal access pin. A clock signal line 22 includes a first sub-clock signal line 221 and a second sub-clock signal line 222 connected with each other. The first sub-clock signal line 221 is located in the first peripheral region 201 and extends to the first signal access region 301 of the fourth peripheral region 204, and is connected with a signal access pin in the first signal access region 301 so as to be connected with the first driver chip through the signal access pin. The second sub-clock signal line 222 is located in the third peripheral region 203 and extends to the second signal access region 302 of the fourth peripheral region 204, and is connected with a signal access pin in the second signal access region 302 so as to be connected with the second driver chip through the signal access pin.

In some examples, a line width of the initial signal line 21 may be about 18 microns and a line width of the clock signal line 22 may be about 18 microns. In this example, "line width" is a size of a signal line in a direction perpendicular to its extension direction in a plane parallel to the display substrate.

In this exemplary embodiment, by electrically connecting sub-clock signal lines connecting different drive chips, together in the peripheral region, it may be ensured that different drive chips output consistent clock signals. By connecting sub-initial signal lines connecting different driver chips, together in the peripheral region, it may be ensured that different driver chips output consistent initial signals. Thus, a case that gate control signals of gate drive circuits on both sides of the display substrate are not synchronized may be improved, so as to improve a display effect.

In some exemplary implementation modes, as shown in FIG. 1, the first sub-initial signal line 211 and the second sub-initial signal line 212 of the initial signal line 21 may be an integral structure. The first sub-clock signal line 221 and the second sub-clock signal line 222 of the clock signal line 22 may be an integral structure. However, this embodiment is not limited thereto. In some examples, the first sub-initial signal line 211 and the second sub-initial signal line 212 of the initial signal line 21 are connected in the second peripheral region 202. The first sub-clock signal line 221 and the second sub-clock signal line 222 of the clock signal line 22 are connected in the second peripheral region 202.

In some exemplary implementation modes, the first peripheral region 201 and the third peripheral region 203 are provided with gate drive circuits. The first peripheral region 201 and the third peripheral region 203 each include at least one first sub-region and at least one second sub-region. Both the first sub-region and the second sub-region are adjacent to the display region 100. The first sub-region and the second sub-region are communicated. A gate drive circuit may be located in the first sub-region and the second sub-region may be a region, other than the first sub-region, in the first peripheral region 201 or the third peripheral region 203. For example, a region A1 shown in FIG. 1 is located in a first sub-region of the first peripheral region 201, a region A2 is a juncture of the first peripheral region 201 and the second peripheral region 202, and a region A3 is located in the second peripheral region 202. In some examples, a position where the first sub-initial signal line 211 and the second sub-initial signal line 212 of the initial signal line 21 are connected may be located in the second peripheral region 202, or in a second sub-region of the first peripheral region 201, or in a second sub-region of the third peripheral region 203. However, this embodiment is not limited thereto.

In some exemplary implementation modes, the gate drive circuit may include four drivers (e.g., a scan driver, a first reset driver, a second reset driver, and an emission driver) located in the first peripheral region 201 on a left side of the display region and four same drivers located in the third peripheral region 203 on a right side of the display region. Scan drivers on left and right sides of the display region are configured to provide scan signals to sub-pixels in the display region through scan lines, first reset drivers on the left and right sides of the display region are configured to provide first reset signals to the sub-pixels in the display region through first reset lines, second reset drivers on the left and right sides of the display region are configured to provide second reset signals to the sub-pixels in the display region through second reset lines, and emission drivers on the left and right sides of the display region are configured to provide emission signals to the sub-pixels in the display region through emission lines. In some examples, any one of drivers may include multiple cascaded sub-drive circuits. However, this embodiment is not limited thereto. In some examples, the gate drive circuit may include a scan driver and an emission driver, or include a scan driver, an emission driver, and a reset driver.

Figure 4:
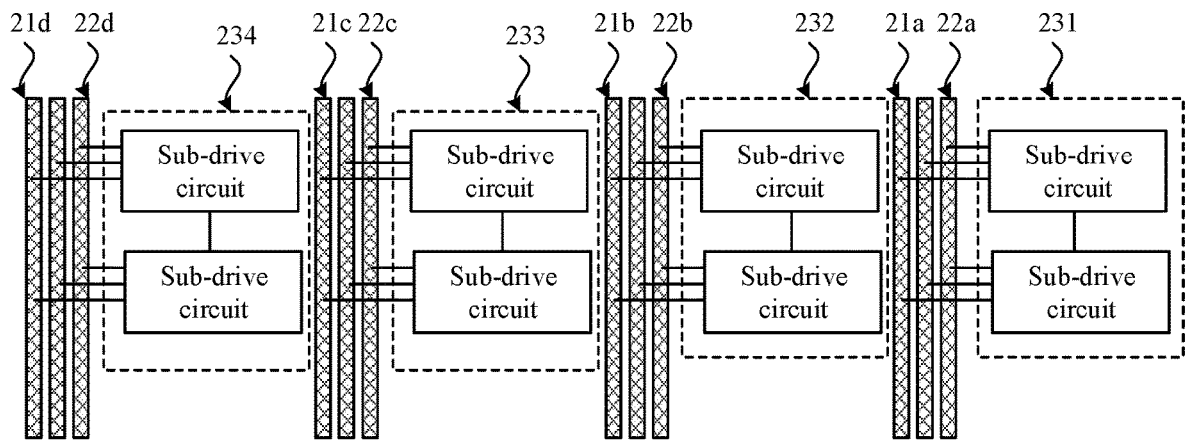
FIG. 4 is a partial schematic diagram of a region A1 in FIG. 1.

FIG. 4 is a partial schematic diagram of the region A1 in FIG. 1. The region A1 in FIG. 1 is the first sub-region of the first peripheral region 201. In some exemplary implementation modes, as shown in FIG. 4, a first driver 231, a second driver 232, a third driver 233, and a fourth driver 234 are provided in the first peripheral region 201 on a left side of the display region 100. The first driver 231, the second driver 232, the third driver 233, and the fourth driver 234 are sequentially arranged along one side away from the display region 100. In some examples, the first driver 231 may be a scan driver, the second driver 232 may be a first reset driver, the third driver 233 may be a second reset driver, and the fourth driver 234 may be an emission driver. However, this embodiment is not limited thereto.

In some exemplary implementation modes, four drivers each include multiple cascaded sub-drive circuits. A sub-drive circuits included in a scan driver, a sub-drive circuits included in a first reset driver, and a sub-drive circuits included in a second reset driver may all be of an 8T2C (i.e., eight transistors and two capacitors) structure, a sub-drive circuit included in an emission driver may be of a 10T3C (i.e., ten transistors and three capacitors) structure or a 12T2T (i.e., twelve transistors and two capacitors) structure. However, this embodiment is not limited thereto.

In some exemplary implementation modes, as shown in FIG. 4, multiple clock signal lines (e.g., clock signal lines 22a, 22b, 22c, and 22d) and multiple initial signal lines (e.g., initial signal lines 21a, 21b, 21c, and 21d) are provided in the first peripheral region 201 on the left side of the display region 100. In some examples, the multiple first signal lines in the first peripheral region 201 may be divided into multiple groups, for example, a group of first signal lines may include an initial signal line and two clock signal lines. A group of first signal lines are connected with a driver. As shown in FIG. 4, a sub-drive circuit of the first driver 231 is electrically connected with an initial signal line 21a and two clock signal lines 22a, and the initial signal line 21a is located on one side of the two clock signal lines 22a away from the first driver 231. A sub-drive circuit of the second driver 232 is electrically connected with an initial signal line 21b and two clock signal lines 22b, and the initial signal line 21b is located on one side of the two clock signal lines 22b away from the second driver 232. A sub-drive circuit of the third driver 233 is electrically connected with an initial signal line 21c and two clock signal lines 22c and the initial signal line 21c is located on a side of the two clock signal lines 22c away from the third driver 233. A sub-drive circuit of the fourth driver 234 is electrically connected with an initial signal line 21d and two clock signal lines 22d, and the initial signal line 21d is located on one side of the two clock signal lines 22d away from the fourth driver 234. Regarding arrangement and connection manners of drivers and first signal lines in the third peripheral region 203 on the right side of the display region 100, reference may be made to a structure in the first peripheral region 201 on the left side of the display region 100, and will not be repeated here.

Figure 5:
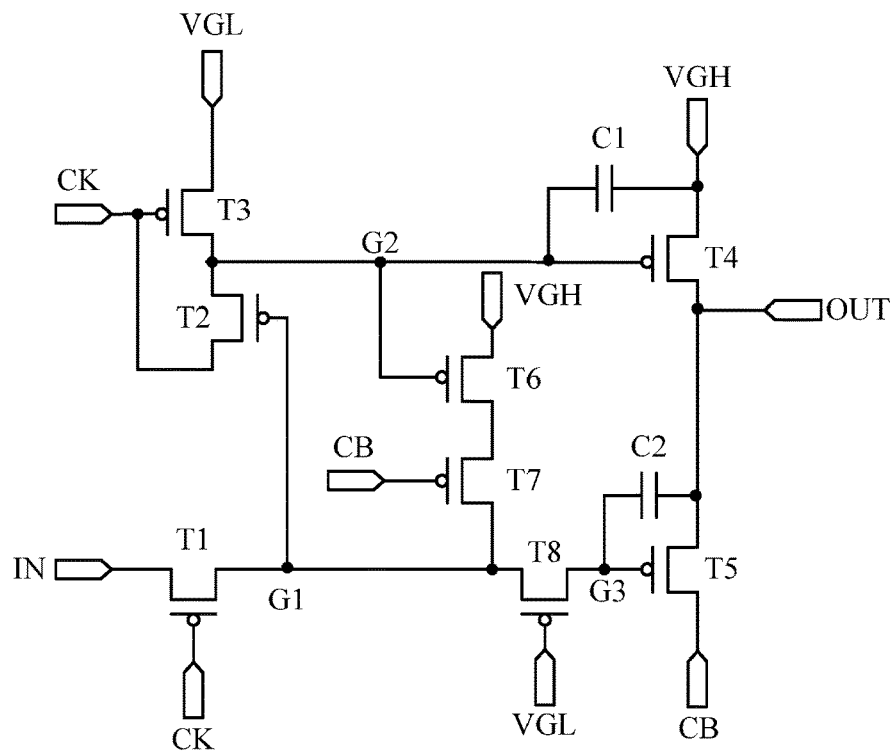
FIG. 5 is an equivalent circuit diagram of a sub-drive circuit according to at least one embodiment of the present disclosure.
Figure 6:
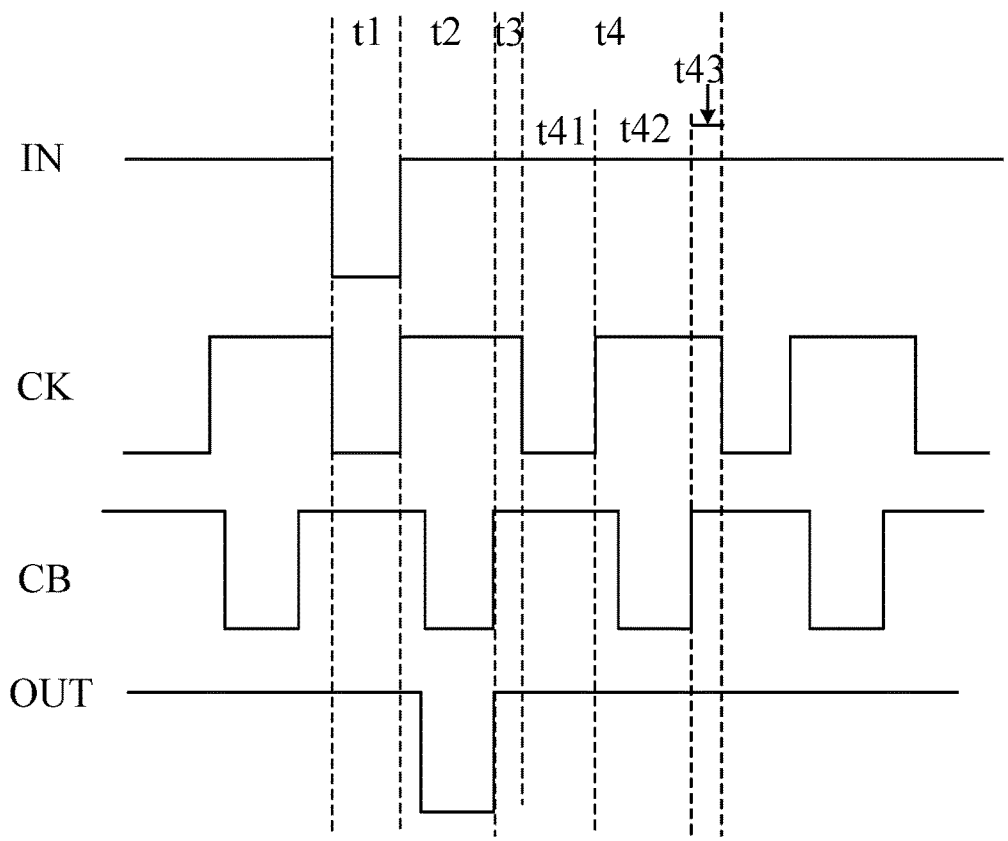
FIG. 6 is a timing diagram of the sub-drive circuit provided in FIG. 5.

FIG. 5 is an equivalent circuit diagram of a sub-drive circuit according to at least one embodiment of the present disclosure. FIG. 6 is a timing diagram of the sub-drive circuit provided in FIG. 5. As shown in FIG. 5, in some exemplary implementation modes, the sub-drive circuit is electrically connected with a signal input terminal IN, a first clock signal line CK, a second clock signal line CB, a first power line VGH, a second power line VGL, and a signal output terminal OUT, respectively.

In some exemplary implementation modes, as shown in FIG. 5, the sub-drive circuit may include a first shift transistor T1, a second shift transistor T2, a third shift transistor T3, a fourth shift transistor T6, a fifth shift transistor T7, a sixth shift transistor T8, a first output transistor T4, a second output transistor T5, a first storage capacitor C1, and a second storage capacitor C2.

A control electrode of the first shift transistor T1 is electrically connected with the first clock signal line CK, a first electrode of the first shift transistor T1 is electrically connected with the signal input terminal IN, and a second electrode of the first shift transistor T1 is electrically connected with a first node G1. A control electrode of the second shift transistor T2 is electrically connected with the first node G1, a first electrode of the second shift transistor T2 is electrically connected with the first clock signal line CK, and a second electrode of the second shift transistor T2 is electrically connected with a second node G2. A control electrode of the third shift transistor T3 is electrically connected with the first clock signal line CK, a first electrode of the third shift transistor T3 is electrically connected with the second power line VGL, and a second electrode of the third shift transistor T3 is electrically connected with the second node G2. A control electrode of the first output transistor T4 is electrically connected with the second node G2, a first electrode of the first output transistor T4 is electrically connected with the first power line VGH, and a second electrode of the first output transistor T4 is electrically connected with the signal output terminal OUT. A control electrode of the second output transistor T5 is electrically connected with a third node G3, a first electrode of the second output transistor T5 is electrically connected with the second clock signal line CB, and a second electrode of the second output transistor T5 is electrically connected with the signal output terminal OUT. A control electrode of the fourth shift transistor T6 is electrically connected with the second node G2, a first electrode of the fourth shift transistor T6 is electrically connected with the first power line VGH, and a second electrode of the fourth shift transistor T6 is electrically connected with a first electrode of the fifth shift transistor T7. A control electrode of the fifth shift transistor T7 is electrically connected with the second clock signal line CB, and a second electrode of the fifth shift transistor T7 is electrically connected with the first node G1. A control electrode of the sixth shift transistor T8 is electrically connected with the second power line VGL, a first electrode of the sixth shift transistor T8 is electrically connected with the first node G1, and a second electrode of the sixth shift transistor T8 is electrically connected with the third node G3. A first electrode of the first storage capacitor C1 is electrically connected with the first power line VGH, and a second electrode of the first storage capacitor C1 is electrically connected with the second node G2. A first electrode of the second storage capacitor C2 is electrically connected with the signal output terminal OUT, and a second electrode of the second storage capacitor C2 is electrically connected with the third node G3.

In some exemplary implementation modes, the first power line VGH provides high-level signals continuously, and the second power line VGL provides low-level signals continuously.

In some exemplary implementation modes, the first to sixth shift transistors, the first output transistor, and the second output transistor of the sub-drive circuit shown in FIG. 5 may all be P-type transistors or N-type transistors. However, this embodiment is not limited thereto.

In some exemplary implementation modes, taking a case that the first to sixth shift transistors, the first output transistor, and the second output transistor of the sub-drive circuit shown in FIG. 5 may all be P-type transistors as an example, as shown in FIG. 6, a working process of the sub-drive circuit of this embodiment may include following stages.

In an input stage t1, a signal of the first clock signal line CK is at a low level, a signal of the second clock signal line CB is at a high level, and a signal of the signal input terminal IN is at a low level. Since the signal of the first clock signal line CK is at the low level, the first shift transistor T1 is turned on, and the signal of the signal input terminal IN is transmitted to the first node G1 via the first shift transistor T1. Since the sixth shift transistor T8 receives a low-level signal of the second power line VGL, the sixth shift transistor T8 is in a turn-on state. A level of the third node G3 may control the second output transistor T5 to be turned on, and the signal of the second clock signal line CB is transmitted to the signal output terminal OUT via the second output transistor T5, that is, in the input stage t1, a signal of the signal output terminal OUT is the high-level signal of the second clock signal line CB. In addition, since the signal of the first clock signal line CK is at the low level, the third shift transistor T3 is turned on, and the low-level signal of the second power line VGL is transmitted to the second node G2 via the third shift transistor T3. At this time, both the first output transistor T4 and the fourth shift transistor T6 are turned on. Since the signal of the second clock signal line CB is at the high level, the fifth shift transistor T7 is turned off.

In an output stage t2, a signal of the first clock signal line CK is at a high level, a signal of the second clock signal line CB is at a low level, and a signal of the signal input terminal IN is at a high level. The second output transistor T5 is turned on and the signal of the second clock signal line CB is used as a signal of the signal output terminal OUT via the second output transistor T5. In the output stage t2, a level of one end of the second storage capacitor C2 which is connected with the signal output terminal OUT becomes a signal of the second power line VGL. Due to a bootstrap function of the second storage capacitor C2, the sixth shift transistor T8 is turned off, the second output transistor T5 may be turned on better, and the signal of the signal output terminal OUT is at a low level. In addition, the signal of the first clock signal line CK is at the high level, thus both the first shift transistor T1 and the third shift transistor T3 are turned off. The second shift transistor T2 is turned on, and the high-level signal of the first clock signal line CK is transmitted to the second node G2 via the second shift transistor T2, thus both the first output transistor T4 and the fourth shift transistor T6 are turned off. Since the signal of the second clock signal line CB is at the low level, the fifth shift transistor T7 is turned on.

In a buffer stage t3, signals of the first clock signal line CK and the second gate clock line CB are both at a high level, a signal of the signal input terminal IN is e at a high level, the second output transistor T5 is turned on, and a signal of the second gate clock line CB is transmitted to the signal output terminal OUT via the second output transistor T5, at this time the signal output terminal OUT output a high-level signal provided by the second clock signal line CB. In addition, a signal of the first clock signal line CK is at the high level, thus both the first shift transistor T1 and the third shift transistor T3 are turned off, the sixth shift transistor T8 is turned on, the second shift transistor T2 is turned on, and the high-level signal of the first clock signal line CK is transmitted to the second node G2 via the second shift transistor T2, thus both the first output transistor T4 and the fourth shift transistor T6 are turned off. Since the signal of the second clock signal line CB is at the high level, the fifth shift transistor T7 is turned off.

In a first sub-stage t41 of a stabilization stage t4, a signal of the first clock signal line CK is at a low level, a signal of the second clock signal line CB is at a high level, and a signal of the signal input terminal IN is at a high level. Since the signal of the first clock signal line CK is at the low level, the first shift transistor T1 is turned on, the signal of the signal input terminal IN is transmitted to the first node G1 via the first shift transistor T1, and the second shift transistor T2 is turned off. Since the sixth shift transistor T8 is in a turn-on state, the second output transistor T5 is turned off. Since the signal of the first clock signal line CK is at the low level, the third shift transistor T3 is turned on, both the first output transistor T4 and the fourth shift transistor T6 are turned on, and a high-level signal of the first power line VGH is transmitted to the signal output terminal OUT via the first output transistor T4, that is, the signal output terminal OUT outputs a high-level signal.

In a second sub-stage t42 of the stabilization stage t4, a signal of the first clock signal line CK is at a high level, a signal of the second clock signal line CB is at a low level, and a signal of the signal input terminal IN is at a high level. Both the second output transistor T5 and the second shift transistor T2 are turned off. The signal of the first clock signal line CK is at the high level, thus both the first shift transistor T1 and the third shift transistor T3 are turned off. Under a holding action of the first storage capacitor C1, both the first output transistor T4 and the fourth shift transistor T6 are turned on, and a high-level signal is transmitted to the signal output terminal OUT via the first output transistor T4, that is, the signal output terminal OUT outputs a high-level signal.

In the second sub-stage t42, since the signal of the second clock signal line CB is at the low level, the fifth shift transistor T7 is turned on, thus a high-level signal is transmitted to the third node G3 and the first node G1 via the fourth shift transistor T6 and the fifth shift transistor T7, so as to keep signals of the third node G3 and the first node G1 at a high level.

In a third sub-stage t43, signals of the first clock signal line CK and the second clock signal line CB are both at a high level, and a signal of the signal input terminal INPUT is at a high level. The second output transistor T5 and the second shift transistor T2 are turned off. A signal of the first clock signal line CK is at the high level, thus both the first shift transistor T1 and the third shift transistor T3 are turned off, and both the first output transistor T4 and the fourth shift transistor T6 are turned on. A high-level signal is transmitted to the signal output terminal OUT via the first output transistor T4, that is, the signal output terminal OUT outputs a high-level signal.

Figure 7:
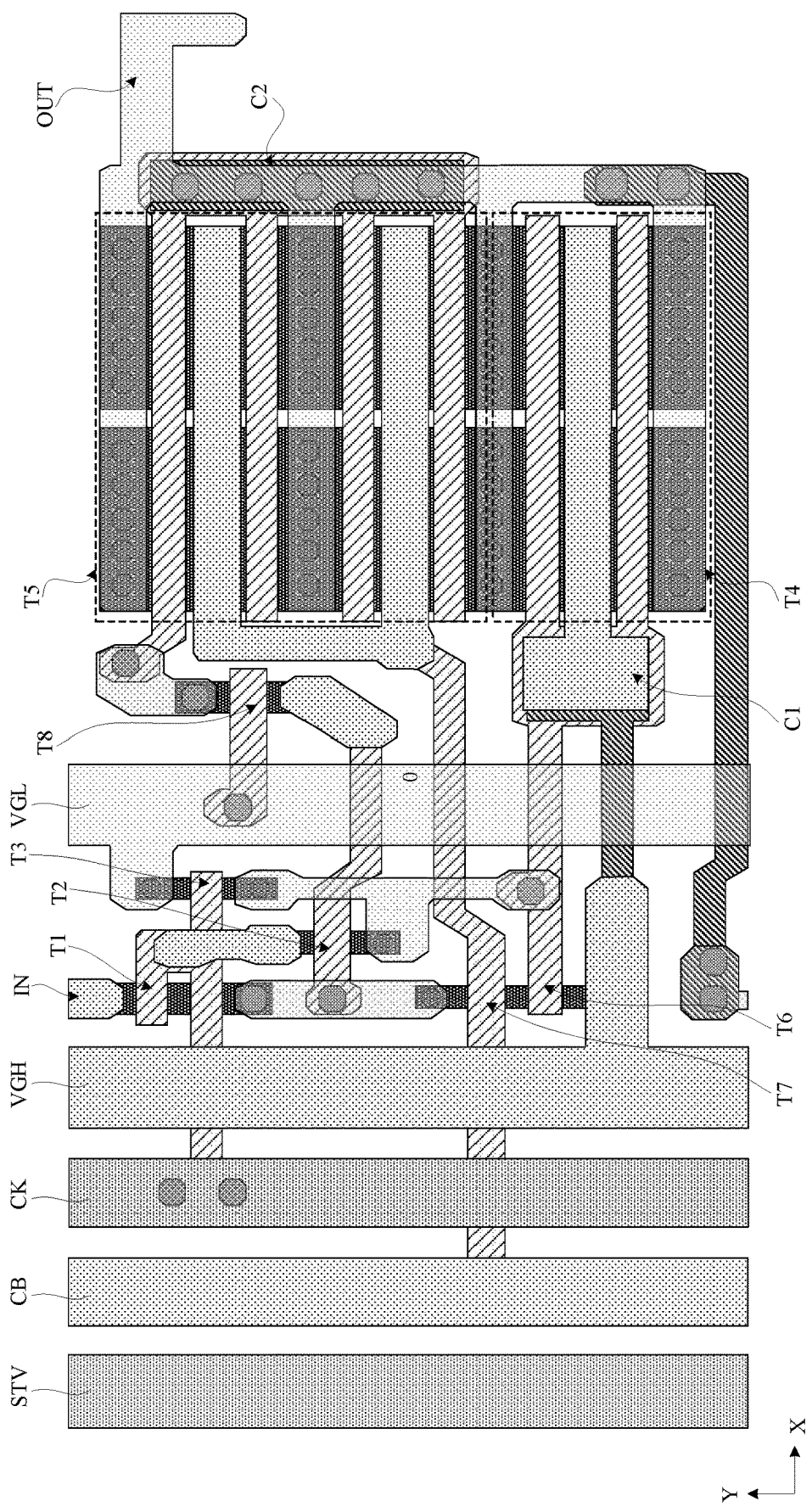
FIG. 7 is a schematic plane view of a sub-drive circuit according to at least one embodiment of the present disclosure.

FIG. 7 is a schematic plane view of a sub-drive circuit according to at least one embodiment of the present disclosure. An equivalent circuit of the sub-drive circuit of this example is shown in FIG. 5. In some exemplary implementation modes, as shown in FIG. 7, in a plane parallel to the display substrate, the first output transistor T4 is adjacent to the second output transistor T5 in a second direction Y, the first shift transistor T1, the second shift transistor T2, and the third shift transistor T3 are arranged sequentially in a first direction X, the fourth shift transistor T6 is adjacent to the fifth shift transistor T7 in the second direction Y, and the sixth shift transistor T8 is located between the second power line VGL and the second output transistor T5 in the first direction X. In the first direction X, the first storage capacitor C1 is located between the second power line VGL and the first output transistor T4, and the second storage capacitor C2 is located on one side of the second output transistor T5 close to the signal output terminal OUT. An initial signal line STV, the second clock signal line CB, the first clock signal line CK, the first power line VGH, and the second power line VGL are arranged along the first direction X. A signal input terminal IN of a sub-drive circuit of this stage is electrically connected with a signal output terminal of a sub-drive circuit of a previous stage, and a signal output terminal OUT of the sub-drive circuit of this stage is electrically connected with a signal input terminal of a sub-drive circuit of a next stage.

In some exemplary implementation modes, as shown in FIG. 7, a ratio of width to length of the second output transistor T5 is greater than that of the first output transistor T4. For example, a width of a conductive channel of the second output transistor T5 is twice that of a conductive channel of the first transistor T4. A ratio of width to length of a transistor refers to a ratio of width to length of a conductive channel of the transistor, that is, W/L. A width of the conductive channel may be a dimension along a direction perpendicular to an extension direction (e.g., a length along the second direction Y), and a length of the conductive channel may be a dimension along the extension direction (e.g., a length along the first direction X). In this exemplary implementation mode, by extending the ratio of width to length of the second output transistor, a duration of a falling edge of an output waveform of the sub-drive circuit may be reduced, thereby increasing a writing duration of a data voltage.

In some exemplary implementation modes, as shown in FIG. 7, the first power line VGH and the second power line VGL may be of a single-layer wiring structure. The initial signal line STV, the first clock signal line CK, and the second clock signal line CB may be of a double-layer wiring structure. However, this embodiment is not limited thereto. For example, the first power line VGH and the second power line VGL may be of a double-layer wiring structure.

Figure 8:
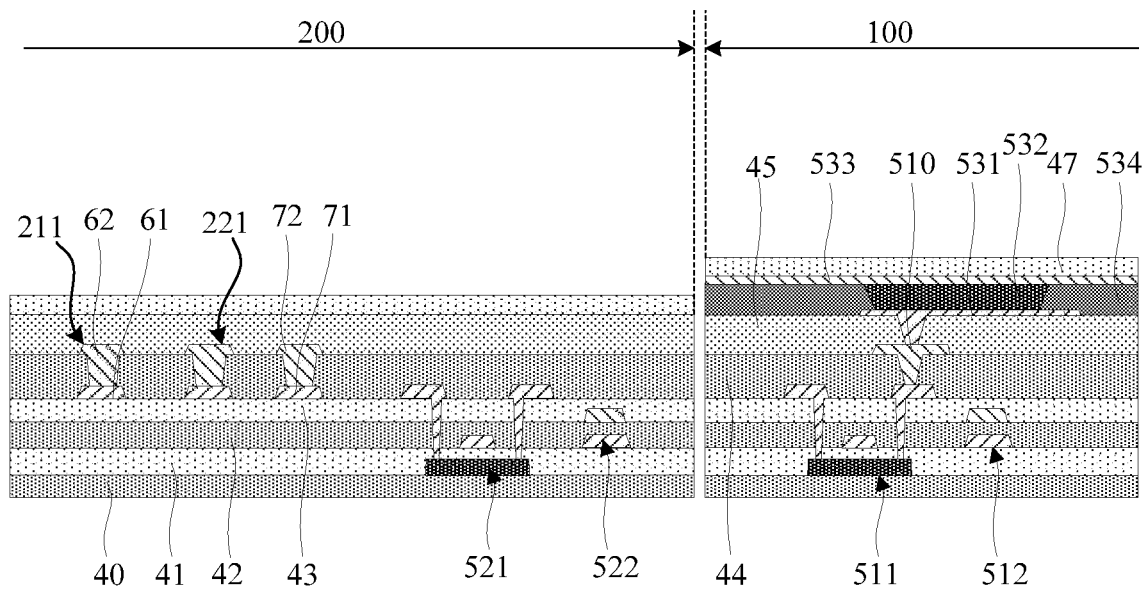
FIG. 8 is a partial schematic sectional view taken along a direction Q-Q' in FIG. 1.

FIG. 8 is a partial schematic sectional view taken along a direction Q-Q' in FIG. 1. A structure of one sub-pixel of the display region 100, a first transistor 521 (e.g., the first output transistor T4 in FIG. 5) and a first capacitor 522 (e.g., the first storage capacitor C1 in FIG. 5) of a gate drive circuit of the peripheral region 200, and an initial signal line and two clock signal lines (e.g., the first clock signal line CK and second clock signal lines CB in FIG. 5) is shown in FIG. 8.

In some exemplary implementation modes, as shown in FIG. 8, in a plane perpendicular to the display substrate, the display region 100 may include a drive structure layer disposed on the base substrate 40, a light emitting element disposed on one side of the drive structure layer away from the base substrate 40, and an encapsulation layer 47 disposed on one side of the light emitting element away from the base substrate 40. In some possible implementation modes, the display region 100 may include another film layer, such as a post spacer, the present disclosure is not limited thereto.

In some exemplary implementation modes, the base substrate 40 may be a flexible base substrate or a rigid base substrate. A drive structure layer of each sub-pixel may include multiple thin film transistors and a storage capacitor that form a pixel circuit. A case that one second transistor 511 and one second storage capacitor 512 are included in one sub-pixel is taken as an example for illustration in FIG. 8. A drive structure layer may include a semiconductor layer, a first gate metal layer, a second gate metal layer, a first source drain metal layer, and a second source drain metal layer which are disposed on the base substrate 40 sequentially. The semiconductor layer of the display region 100 at least includes an active layer of the second transistor 511; the first gate metal layer at least includes a gate of the second transistor 511 and a first capacitor electrode of the storage capacitor 512; the second gate metal layer at least includes a second capacitor electrode of the storage capacitor 512; the first source drain metal layer at least includes a source electrode and a drain electrode of the second transistor 511; the second source drain metal layer at least includes a connection electrode 510. A first insulation layer 41 is disposed between the semiconductor layer and the first gate metal layer, a second insulation layer 42 is disposed between the first gate metal layer and the second gate metal layer, a third insulation layer 43 is disposed between the second gate metal layer and the first source drain metal layer, a fourth insulation layer 44 is disposed between the first source drain metal layer and the second source drain metal layer, and a fifth insulation layer 45 is disposed between the second source drain metal layer and the light emitting element. The first insulation layer 41 and the second insulation layer 42 may also be referred to as gate insulators, the third insulation layer 43 may also be referred to as an interlayer dielectric layer, and the fourth insulation layer 44 and the fifth insulation layer 45 may also be referred to as planarization layers. In some examples, the first insulation layer 41 to the third insulation layer 43 may be inorganic insulation layers, and the fourth insulation layer 44 and the fifth insulation layer 45 may be organic insulation layers. However, this embodiment is not limited thereto.

In some exemplary implementation modes, the light emitting element may include a first electrode 531, a pixel definition layer 534, an organic emitting layer 532, and a second electrode 533. The first electrode 531 is connected with the connection electrode 510 through a via, and the connection electrode 510 is connected with the drain electrode of the second transistor 511. The organic emitting layer 532 is connected with the first electrode 531, and the second electrode 533 is connected with the organic emitting layer 532. The organic emitting layer 532 emits light of a corresponding color under drive of the first electrode 531 and the second electrode 533. In some examples, the first electrode 531 may be an anode and the second electrode 533 may be a cathode. The encapsulation layer 47 may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is disposed between the first encapsulation layer and the third encapsulation layer, so as to ensure that external water vapor cannot enter the light emitting element.

In some exemplary implementation modes, the organic emitting layer 532 may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) which are stacked. In some examples, hole injection layers and electron injection layers of all sub-pixels may be connected together to be a common layer, hole transport layers and electron transport layers of all the sub-pixels may be connected together to be a common layer, hole block layers of all the sub-pixels may be connected together to be a common layer, and emitting layers and electron block layers of adjacent sub-pixels may be overlapped slightly, or may be isolated. However, this embodiment is not limited thereto.

In some exemplary implementation modes, as shown in FIG. 8, in the plane perpendicular to the display substrate, the peripheral region 200 of the display substrate may include a semiconductor layer, a first conductive layer, a second conductive layer, a third conductive layer, and a fourth conductive layer that are disposed on the base substrate 40 sequentially. The semiconductor layer of the peripheral region 200 and the semiconductor layer of the display region 100 may be of a same layer structure, the first conductive layer of the peripheral region 200 and the first gate metal layer of the display region 100 may be of a same layer structure, the second conductive layer of the peripheral region 200 and the second gate metal layer of the display region 100 may be of a same layer structure, the third conductive layer of the peripheral region 200 and the first source drain metal layer of the display region 100 may be of a same layer structure, and the fourth conductive layer of the peripheral region 200 and the second source drain metal layer of the display region 100 may be of a same layer structure.

In some exemplary implementation modes, as shown in FIG. 8, the semiconductor layer of the peripheral region 200 at least includes an active layer of the first transistor 521. The first conductive layer at least includes a control electrode of the first transistor 521 and a first capacitor electrode of the first capacitor 522. The second conductive layer at least includes a second capacitor electrode of the first capacitor 522. The third conductive layer at least includes a first electrode and a second electrode of the first transistor 521, a first wiring 61a of the first sub-initial signal line 211, and a first wiring 71a of the first sub-clock signal line 221. The fourth conductive layer at least includes a second wiring 62a of the first sub-initial signal line 211 and a second wiring 72a of the first sub-clock signal line 221.

In some examples, the second wiring 62a of the first sub-initial signal line 211 may be in direct contact with the first wiring 61a through a groove provided in the fourth insulation layer 44, and the second wiring 72a of the first sub-clock signal line 221 may be in direct contact with the first wiring 71a through the groove provided in the fourth insulation layer 44. An orthographic projection of the second wiring 62a of the first sub-initial signal line 211 on the base substrate 40 is overlapped with an orthographic projection of the first wiring 61a on the base substrate 40, for example, the two coincide with each other. An orthographic projection of the second wiring 72a of the first sub-clock signal line 221 on the base substrate 40 is overlapped with an orthographic projection of the first wiring 71a on the base substrate 40, for example, the two coincide with each other. However, this embodiment is not limited thereto.

In some exemplary implementation modes, as shown in FIG. 7 and FIG. 8, the initial signal line STV, the first clock signal line CK, and the second clock signal line CB may be double-layer wirings, which are located on the third conductive layer and the fourth conductive layer. The first power line VGH and the second power line VGL may be located on the third conductive layer. However, this embodiment is not limited thereto.

In this exemplary implementation mode, a resistance may be reduced by configuring that a double-layer wiring method is adopted for a clock signal line (e.g., the first clock signal line CK and the second clock signal line CB) and an initial signal line in the peripheral region, thereby improving a signal transmission efficiency.

Figure 9:
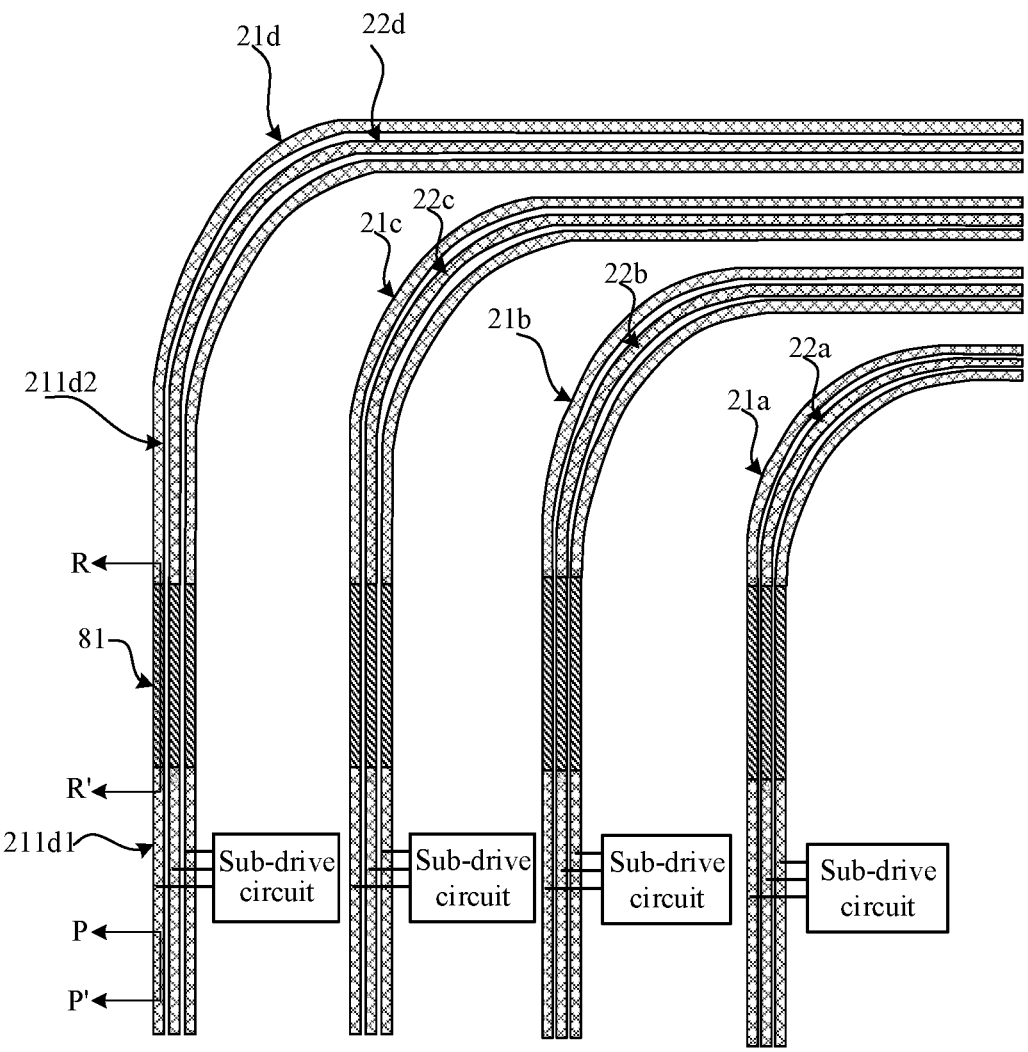
FIG. 9 is a partial schematic diagram of a region A2 in FIG. 1.
Figure 10:
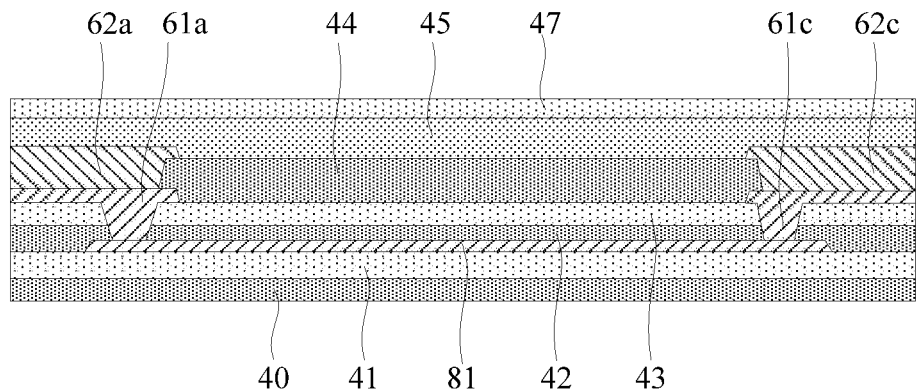
FIG. 10 is a partial schematic sectional view taken along a direction R-R' in FIG. 9.
Figure 11:
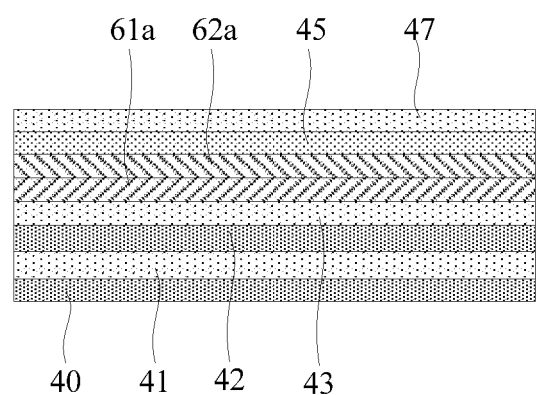
FIG. 11 is a partial schematic sectional view taken along a direction P-P' in FIG. 9.

FIG. 9 is a partial schematic diagram of a region A2 in FIG. 1. FIG. 10 is a partial schematic sectional view taken along a direction R-R' in FIG. 9. FIG. 11 is a partial schematic sectional view taken along a direction P-P' in FIG. 9. Multiple initial signal lines and multiple clock signal lines in corner regions of upper and left bezels of the display base substrate are illustrated in FIG. 9. An initial signal line 21d is taken as an example for following description.

In some exemplary implementation modes, as shown in FIG. 1 and FIG. 9, the first initial signal line 21d may include a first sub-initial signal line and a second sub-initial signal line which are connected with each other. A position where the first sub-initial signal line is connected with the second sub-initial signal line may be located in a region of an upper bezel. The first sub-initial signal line extends from a left bezel to the upper bezel, and is connected with the first driver chip; the second sub-initial signal line extends from a right bezel to the upper bezel, and is connected with the second driver chip. The first sub-initial signal line may include a first signal line segment 211d1 and a second signal line segment 211d2, the first signal line segment 211d1 may extend to the first signal access region 301 and is connected with the first driver chip, and the second signal line segment 211d2 may be connected with the second sub-initial signal line at the upper bezel. In some examples, the second signal line segment 211d2 is electrically connected with the second sub-initial signal line at the upper bezel. However, this embodiment is not limited thereto. For example, the second signal line segment 211d2 and the second sub-initial signal line may be of an integral structure.

In some exemplary implementation modes, as shown in FIG. 9 and FIG. 10, the first signal line segment 211d1 and the second signal line segment 211d2 of the first sub-initial signal line of the initial signal line 21d are electrically connected with each other by a connection line 81. The first signal line segment 211d1 includes a first wiring 61a and a second wiring 62a electrically connected with each other, and the second signal line segment 211d2 includes a first wiring 61c and a second wiring 62c electrically connected with each other. The first wiring 61a and the first wiring 61c are located on the third conductive layer and the second wiring 62a and the second wiring 62c are located on the fourth conductive layer. An orthographic projection of the second wiring 62a on the base substrate 40 is overlapped with an orthographic projection of the first wiring 61a on the base substrate 40, and an orthographic projection of the second wiring 62c on the base substrate 40 is overlapped with an orthographic projection of the first wiring 61c on the base substrate 40. The first wiring 61a may be electrically connected with one end of the connection line 81 through a via provided on the second insulation layer 42 and the third insulation layer 43; the first wiring 61c may be electrically connected with the other end of the connection line 81 through a via provided on the second insulation layer 42 and the third insulation layer 43. An electrical connection between the first signal line segment 211d1 and the second signal line segment 211d2 may be achieved using the connection line 81. However, this embodiment is not limited thereto. For example, the connection line 81 may be connected between the second wiring 62a and the second wiring 62c, or the connection line 81 may be electrically connected between the first wiring 61a and the second wiring 62c, or the connection line 81 may be electrically connected between the second wiring 62a and the first wiring 61c.

In some exemplary implementation modes, a length of the connection line 81 in an extension direction may be about 50 microns (μm) to 500 microns. However, this embodiment is not limited thereto.

In some exemplary implementation modes, as shown in FIG. 11, the first wiring 61a and the second wiring 62a of the first signal line segment 211d1 of the first sub-initial signal line of the initial signal line 21d are in direct contact to achieve an electrical connection. For example, a groove exposing the first wiring 61a may be provided on the fourth insulation layer and the second wiring 62a is formed in the groove to achieve a direct electrical connection between the first wiring 61a and the second wiring 62a. However, this embodiment is not limited thereto.

Figure 12:
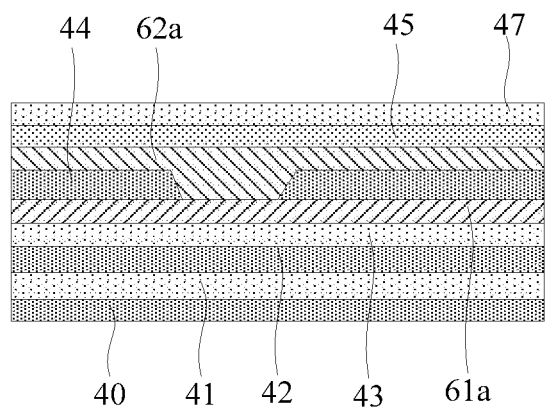
FIG. 12 is another partial schematic sectional view taken along the direction P-P' in FIG. 9.

FIG. 12 is another partial schematic sectional view taken along the direction P-P' in FIG. 9. In some exemplary implementation modes, an electrical connection between the first wiring 61a and the second wiring 62a of the first signal line segment 211d1 of the first sub-initial signal line of the initial signal line 21d may be achieved through a via provided on the fourth insulation layer 44. In this example, multiple vias exposing the first wiring 61a is provided on the fourth insulation layer 44, and the second wiring 62a is formed on one side of the fourth insulation layer 44 away from the base substrate 40 so that the second wiring 62a is electrically connected with the first wiring 61a through the vias. However, this embodiment is not limited thereto.

In some exemplary implementation modes, electrical connections between adjacent signal line segments of multiple initial signal lines and multiple clock signal lines are all achieved through connection lines. As shown in FIG. 9, lengths of multiple connection lines provided in the peripheral region 200 in an extension direction may be approximately the same. The multiple connection lines may be arranged sequentially along a first direction X and aligned in the first direction X. However, this embodiment is not limited thereto. In some examples, the lengths of the multiple connection lines in the peripheral region 200 in the extension direction may be different (e.g., increase along a direction away from the display region or decrease along the direction away from the display region). In some examples, the multiple connection lines may be arranged in an interleaved manner in the first direction X.

In some exemplary implementation modes, a sub-drive circuit is disposed in the first sub-region of the first peripheral region 201 and a connection line may be located in the second sub-region of the first peripheral region 201. As shown in FIG. 9, the connection line 81 is not directly connected with a sub-drive circuit of a driver. For example, the first sub-initial signal line of the initial signal line 21d may be connected with a gate drive circuit and the connection line 81 sequentially in an extension direction (e.g., a second direction Y). In some examples, the connection line 81 may be located in the second sub-region of the first peripheral region 201 close to the first sub-region. For example, the connection line 81 may be connected with the first sub-initial signal line at a starting terminal of the gate drive circuit or connected with the first sub-initial signal line at an ending terminal of the gate drive circuit.

In the display substrate according to this exemplary implementation mode, an electrical connection between adjacent signal line segments of a sub-signal line is achieved by arranging a connection line, which may prevent electrostatic accumulation due to an excessively long signal line in a production process achieving.

Figure 13:
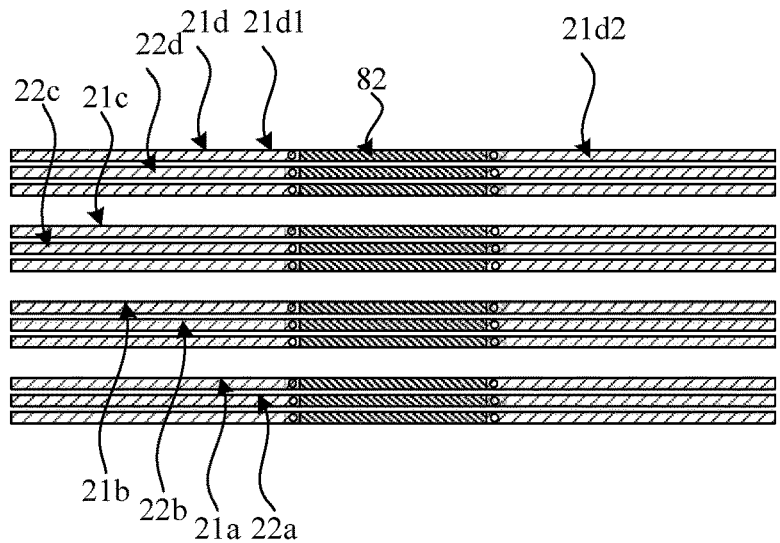
FIG. 13 is a partial schematic diagram of a region A3 in FIG. 1.

FIG. 13 is a partial schematic diagram of a region A3 in FIG. 1. In some exemplary implementation modes, the region A3 is a region where two adjacent sub-signal lines of the first signal line (e.g., initial signal lines 21a to 21d and clock signal lines 22a to 22d) are connected, and the region A3 is located in the second peripheral region 202. In this example, two adjacent sub-signal lines of the first signal line may be electrically connected with each other through a connection line. However, this embodiment is not limited thereto. For example, two adjacent sub-signal lines of the first signal line may be of an integral structure.

The initial signal line 21d is taken as example for following description. As shown in FIG. 13, the initial signal line 21d includes a first sub-initial signal line 21d1 and a second sub-initial signal line 21d2, and the first sub-initial signal line 21d1 and the second sub-initial signal line 21d2 may be electrically connected through a connection line 82. In some examples, the first sub-initial signal line 21d1 may be electrically connected with one end of the connection line 82 through a via, and the second sub-initial signal line 21d2 may be electrically connected with the other end of the connection line 82 through a via.

In some exemplary implementation modes, the first sub-initial signal line 21d1 and the second sub-initial signal line 21d2 may be of a single-layer wiring structure and are both located on the third conductive layer, and the connection line 82 may be located on the first conductive layer or the second conductive layer. Or, the first sub-initial signal line 21d1 and the second sub-initial signal line 21d2 may be of a single-layer wiring structure, the first sub-initial signal line 21d1 is located on the third conductive layer, the second sub-initial signal line 21d2 is located on the fourth conductive layer, and the connection line 82 may be located on the first conductive layer or the second conductive layer. Or, the first sub-initial signal line 21d1 and the second sub-initial signal line 21d2 may be of a double-layer wiring structure and double-layer wirings are located on the third conductive layer and the fourth conductive layer respectively, and the connection line 82 may be located on the first conductive layer or the second conductive layer. However, this embodiment is not limited thereto.

A structure of the display substrate according to the present disclosure will be described below through an example of a preparation process of the display substrate. A "patterning process" mentioned in the present disclosure includes a process such as deposition of a film layer, photoresist coating, mask exposure, development, etching, and photoresist stripping. Deposition may be any one or more of sputtering, evaporation, and chemical vapor deposition, coating may be any one or more of spray coating and spin coating, and etching may be any one or more of dry etching and wet etching. A "thin film" refers to a layer of thin film manufactured by a material on a base substrate using a deposition or coating process. If the "thin film" does not need a patterning process in an entire manufacturing process, the "thin film" may also be called a "layer". If the "thin film" needs a patterning process in the entire manufacturing process, the "thin film" is called a "thin film" before the patterning process and is called a "layer" after the patterning process. A "layer" after a patterning process includes at least one "pattern".

"A and B are of a same layer structure" mentioned in the present disclosure means that A and B are formed simultaneously through a same patterning process. A "same layer" does not always mean that thicknesses of layers or heights of layers are the same in a sectional view. "An orthographic projection of A contains an orthographic projection of B" means that the orthographic projection of B falls within a range of the orthographic projection of A, or the orthographic projection of A covers the orthographic projection of B.

In some exemplary implementation modes, as shown in FIGS. 4, 8, and 10, the preparation process of the display substrate may include following acts.

(1) a Pattern of a Semiconductor Layer is Prepared on a Base Substrate.

In some exemplary implementation modes, a semiconductor thin film is deposited on the base substrate 40, and the semiconductor thin film is patterned through a patterning process to form a pattern of a semiconductor layer. As shown in FIG. 8, the pattern of the semiconductor layer is formed in the display region 100 and the peripheral region 200, for example, at least includes an active layer of the second transistor 511 in the display region 100 and an active layer of the first transistor 521 in the peripheral region 200.

In some exemplary implementation modes, the base substrate 40 may be a rigid base substrate, e.g., a glass base substrate. However, this embodiment is not limited thereto. For example, the base substrate may be a flexible base substrate.

(2) Patterns of a First Gate Metal Layer and a First Conductive Layer are Prepared on the Base Substrate.

In some exemplary implementation modes, a first insulation thin film and a first conductive thin film are sequentially deposited on the base substrate 40 on which the aforementioned structure is formed, the first conductive thin film is patterned through a patterning process to form the first insulation layer 41 covering the pattern of the semiconductor layer, and the first gate metal layer and the first conductive layer disposed on the first insulation layer 41, as shown in FIG. 8. The first gate metal layer is formed in the display region 100 and at least includes a gate of the second transistor 511 and a first capacitor electrode of the second capacitor 512; the first conductive layer is formed in the peripheral region 200 and at least includes a gate of the first transistor 521 and a first capacitor electrode of the first capacitor 522. In some examples, a scan line, a reset line, and an emission line may be formed synchronously in the display region 100 in this act. However, this embodiment is not limited thereto.

(3) Patterns of a Second Gate Metal Layer and a Second Conductive Layer are Prepared on the Base Substrate.

In some exemplary implementation modes, a second insulation thin film and a second conductive thin film are sequentially deposited on the base substrate on which the aforementioned structures are formed, and the second conductive thin film is patterned through a patterning process to form the second insulation layer 42 and patterns of the second gate metal layer and the second conductive layer disposed on the second insulation layer 42. As shown in FIG. 8, the second gate metal layer is formed in the display region 100 and at least includes a second capacitor electrode of the second capacitor 512; the second conductive layer is formed in the peripheral region 200 and at least includes a second capacitor electrode of the first capacitor 522.

(4) Patterns of a First Source Drain Metal Layer and a Third Conductive Layer are Prepared on the Base Substrate.

In some exemplary implementation modes, a third insulation thin film is deposited on the base substrate 40 on which the aforementioned structures are formed, and the third insulation thin film is patterned through a patterning process to form a pattern of the third insulation layer 43. Multiple vias exposing a surface of the semiconductor layer are provided on the third insulation layer 43.

In some exemplary implementation modes, a third conductive thin film is deposited on the base substrate on which the aforementioned structures are formed, and the third conductive thin film is patterned through a patterning process to form patterns of the first source drain metal layer and the third conductive layer on the third insulation layer 43. As shown in FIG. 8, the first source drain metal layer is formed in the display region 100 and at least includes a first electrode and a second electrode of the second transistor 511; the third conductive layer is formed in the peripheral region 200 and at least includes a first electrode and a second electrode of the first transistor 521 and a first wiring of a first signal line. The first electrode and the second electrode of the second transistor 511 may be connected with a source region and a drain region of the active layer of the second transistor 511 through a via respectively. The first electrode and the second electrode of the first transistor 521 may be connected with a source region and a drain region of the active layer of the first transistor 521 through a via respectively.

(5) Patterns of a Second Source Drain Metal Layer and a Fourth Conductive Layer are Prepared on the Base Substrate.

In some exemplary implementation modes, a planarization thin film is coated on the base substrate 40 on which the aforementioned structures are formed, and a pattern of the fourth insulation layer 44 is formed through a patterning process. Multiple vias exposing a surface of the first source drain metal layer and a groove exposing a surface of the third conductive layer are provided on the fourth insulation layer 44.

In some exemplary implementation modes, a fourth conductive thin film is deposited on the base substrate on which the aforementioned structures are formed, and the fourth conductive thin film is patterned through a patterning process to form patterns of the second source drain metal layer and the fourth conductive layer on the fourth insulation layer 44. As shown in FIG. 8, the second source drain metal layer is formed in the display region 100 and at least includes the connection electrode 510; the fourth conductive layer is formed in the peripheral region 200 and at least includes a second wiring of the first signal line. The connection electrode 510 is electrically connected with the first electrode of the second transistor 511 through a via provided on the fourth insulation layer 44. The second wiring of the first signal line is electrically connected with the first wiring of the first signal line through the groove provided on the fourth insulation layer 44.

(6) a Fifth Insulation Layer, a Light Emitting Element, and an Encapsulation Layer are Prepared on the Base Substrate Sequentially.

In some exemplary implementation modes, a planarization thin film is coated on the base substrate 40 on which the aforementioned structures are formed, and the fifth insulation layer 45 is formed through a patterning process. A via exposing the connection electrode 510 is provided on the fifth insulation layer 45.

Subsequently, a first electrode of the light emitting element is formed. As shown in FIG. 8, the first electrode 531 of the light emitting element is formed in the display region 100, and the first electrode 531 is connected with the connection electrode 510 through the via on the fifth insulation layer 45.

Subsequently, a pixel definition thin film is coated through masking, exposure, and development processes to form a pattern of the pixel definition layer 534. As shown in FIG. 8, the pixel definition layer 534 is formed in the display region 100. A pixel opening is provided on the pixel definition layer 534 of the display region 100. The pixel definition thin film in the pixel opening is removed through development to expose a surface of the first electrode 531.

Subsequently, the organic emitting layer 532 and the second electrode 533 are sequentially formed on the base substrate 40 on which the aforementioned patterns are formed. For example, the organic emitting layer 532 includes a hole injection layer, a hole transport layer, an emitting layer, an electron transport layer, and an electron injection layer which are stacked, and is formed in the pixel opening of the display region 100, to achieve a connection between the organic emitting layer 532 and the first electrode 531. Since the first electrode 531 is connected with a drain electrode of a thin film transistor 511, light emitting control of the organic emitting layer 532 is achieved. A portion of the second electrode 533 is formed on the organic emitting layer 532.

In some exemplary implementation modes, the encapsulation layer 47 is formed on the base substrate 40 on which the aforementioned patterns are formed. In some examples, a stacked structure of an inorganic material/an organic material/an inorganic material may be adopted for the encapsulation layer 47. An organic material layer is disposed between two inorganic material layers.

In some exemplary implementation modes, the first conductive thin film, the second conductive thin film, the third conductive thin film, and the fourth conductive thin film may be made of a metal material, such as any one or more of silver (Ag), copper (Cu), aluminum (Al), and molybdenum (Mo), or an alloy material of the above metals, such as an Aluminum Neodymium (AlNd) alloy or a Molybdenum Niobium (MoNb) alloy, and may be of a single-layer structure or a multi-layer composite structure, such as Mo/Cu/Mo. The first insulation layer 41, the second insulation layer 42, and the third insulation layer 43 may be made of any one or more of Silicon Oxide (SiOx), Silicon Nitride (SiNx), and Silicon Oxynitride (SiON), and may be a single layer, a multi-layer, or a composite layer. The fourth insulation layer 44, the fifth insulation layer 45, and the pixel definition layer 534 may be made of an organic material, such as polyimide, acrylic, or polyethylene terephthalate. The first electrode of the light emitting element may be made of a transparent conductive material such as Indium Tin Oxide (ITO) or Indium Zinc Oxide (IZO). The second electrode of the light emitting element may be made of any one or more of magnesium (Mg), silver (Ag), aluminum (Al), copper (Cu), and lithium (Li), or an alloy made of any one or more of the above metals. However, this embodiment is not limited thereto. For example, the first electrode of the light emitting element may be made of a reflective material such as a metal, and the second electrode may be made of a transparent conductive material.

The preparation process according to this exemplary embodiment may be achieved using an existing mature preparation device, may be well compatible with an existing manufacturing process. The process is simple to achieve, easy to implement, high in an efficiency of production, low in a production cost, and high in a yield.

The structure of the display substrate according to this exemplary embodiment and the preparation process thereof are described only illustratively. In some exemplary implementation modes, corresponding structures may be altered and patterning processes may be increased or decreased according to actual needs. For example, a connection line may be located on a second conductive layer. However, this embodiment is not limited thereto.

Figure 14:
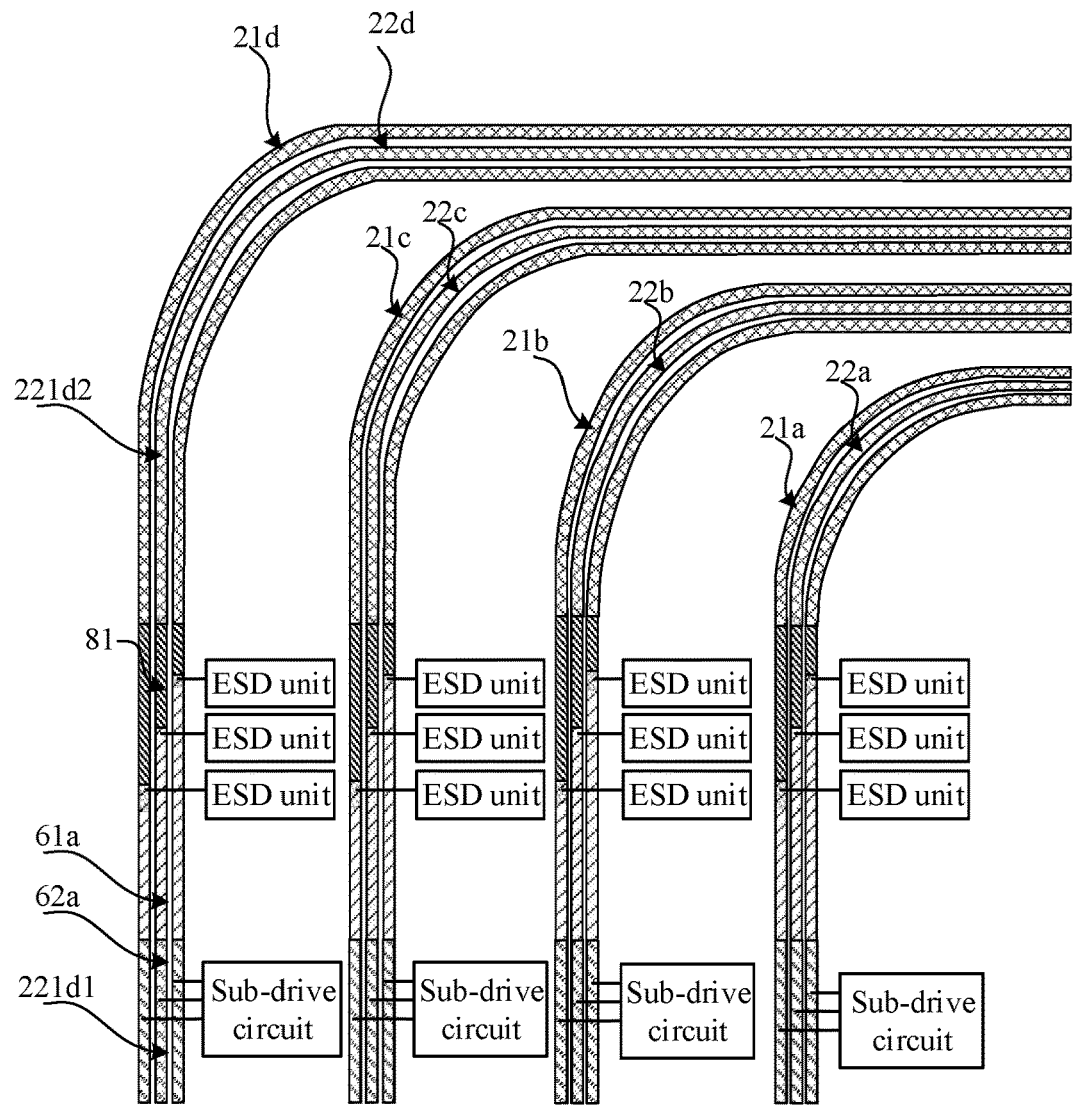
FIG. 14 is another partial schematic diagram of the region A2 in FIG. 1.

FIG. 14 is another partial schematic diagram of the region A2 in FIG. 1. In some exemplary implementation modes, multiple first signal lines (e.g., initial signal lines 21*a* to 21*d* and clock signal lines 22*a* to 22*d*) of the peripheral region 200 are also electrically connected with an Electrostatic Discharge (ESD) unit to provide an electrostatic discharge path in a working process of the display substrate. One clock signal line 22*d* is taken as an example for illustration. The ESD unit may be electrically connected with a first signal line segment 221*d*1 of a first sub-clock signal line of the clock signal line 22*d*, and the first signal line segment 221*d*1 is electrically connected with a second signal line segment 221*d*2 through the connection line 81.

In some exemplary implementation modes, as shown in FIG. 14, the first signal line segment 221*d*1 and the second signal line segment 221*d*2 may be of a double-layer wiring structure. For example, the first signal line segment 221*d*1 includes a first wiring 61*a* and a second wiring 62*a* electrically connected with each other, and the second wiring 62*a* is located on one side of the first wiring 61*a* away from the base substrate. In this example, the first signal line segment 221*d*1 includes a double-layer wiring segment and a single-layer wiring segment. A section where the first signal line segment 221*d*1 is connected with a sub-drive circuit is a double-layer wiring segment, and a section where the first signal line segment 221*d*1 is connected with the ESD unit is a single-layer wiring segment. For example, the ESD unit is electrically connected with the first wiring 61*a* of the first signal line segment 221*d*1.

In some exemplary implementation modes, as shown in FIG. 14, lengths of multiple connection lines 81 along an extension direction may be different. For example, in a same group of first signal lines connected with a same driver, in a direction away from the display region, a length of a connection line connected with a first signal line away from the display region is greater than a length of a connection line connected with a first signal line close to the display region. For example, a length of a connection line connected with the initial signal line 21d is greater than a length of a connection line connected with the clock signal line 22d. However, this embodiment is not limited thereto.

Figure 15:
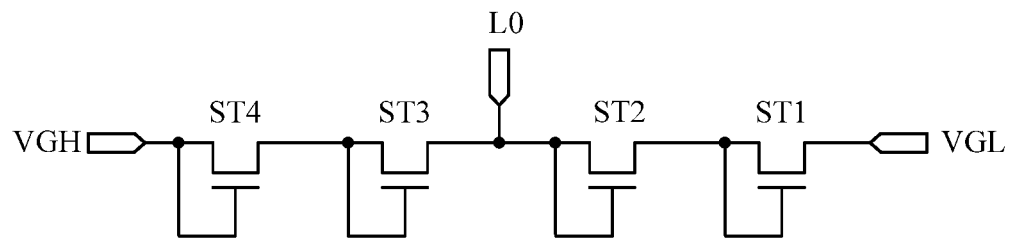
FIG. 15 is an equivalent circuit diagram of an Electrostatic Discharge (ESD) unit according to at least one embodiment of the present disclosure.

FIG. 15 is an equivalent circuit diagram of an ESD unit according to at least one embodiment of the present disclosure. As shown in FIG. 15, in some exemplary implementation modes, at least one ESD unit is electrically connected with one signal line L0 and is configured to discharge static electricity in the connected signal line L0. In this example, the signal line L0 may be a clock signal line or an initial signal line. The ESD unit includes a first discharge transistor ST1 to a fourth discharge transistor ST4.

In some exemplary implementation modes, as shown in FIG. 15, a first electrode of the first discharge transistor ST1 is electrically connected with the second power line VGL, a control electrode and a second electrode of the first discharge transistor ST1 are electrically connected with a first electrode of the second discharge transistor ST2, and a control electrode and a second electrode of the second discharge transistor ST2 are electrically connected with a signal line L0 corresponding to the ESD unit. A first electrode of the third discharge transistor ST3 is electrically connected with the signal line L0 corresponding to the ESD unit, a control electrode and a second electrode of the third discharge transistor ST3 are electrically connected with a first electrode of the fourth discharge transistor ST4, and a control electrode and a second electrode of the fourth discharge transistor ST4 are electrically connected with the first power line VGH.

In an exemplary embodiment, the ESD unit may be configured to avoid damage due to discharge breakdown caused by electrostatic accumulation in a signal line, so as to discharge static electricity accumulated in the signal line and achieve protection of the signal line.

In an exemplary embodiment, the ESD unit may include two discharge transistors, wherein one electrode of each discharge transistor is connected with its own control electrode, so as to form an equivalent diode connection. A signal line to be protected is connected between two "diodes", and the other two terminals of the two "diodes" are connected with the first power line VGH and the second power line VGL respectively. Therefore, when an instantaneous high voltage (e.g., 100V) occurs due to accumulation of positive charges in the signal line, one of the "diodes" is turned on to discharge the positive charges in the signal line, and when an instantaneous low voltage (e.g., −100V) occurs due to accumulation of negative charges in the signal line, the other of the "diode" is turned on to discharge the negative charges in the signal line.

Figure 16:
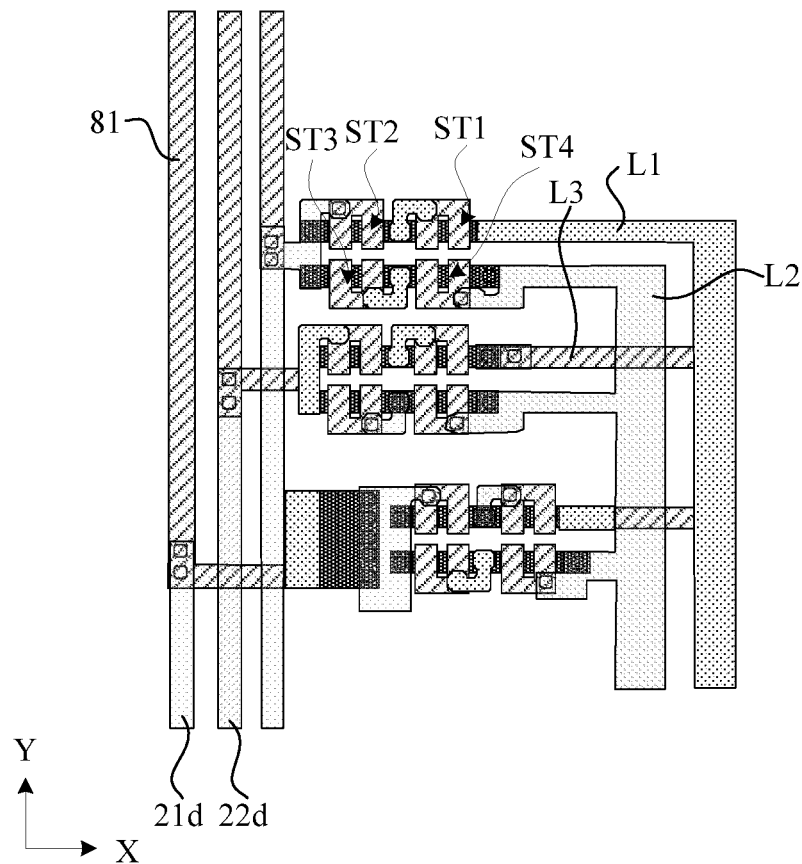
FIG. 16 is a schematic plane view of an ESD unit according to at least one embodiment of the present disclosure.

FIG. 16 is a schematic plane view of an ESD unit according to at least one embodiment of the present disclosure. Three ESD units are illustrated in FIG. 16. Signal lines protected by two of the ESD units are all clock signal lines (e.g., clock signal line 22d), and a signal line protected by last one of the ESD units is an initial signal line (e.g., initial signal line 21d). As shown in FIG. 16, a first discharge transistor ST1 of a first ESD unit may be electrically connected with the second power line VGL through a first lead-out line L1, and a fourth discharge transistor ST4 may be electrically connected with the first power line VGH through a second lead-out line L2. A second discharge transistor ST2 and a third discharge transistor ST3 of the first ESD unit may be electrically connected with a first wiring of a clock signal line 22d and electrically connected with a connection line 81 through the first wiring. A first discharge transistor ST1 of a second ESD unit may be electrically connected with the first lead-out line L1 through a third lead-out line L3, and a fourth discharge transistor ST4 may be electrically connected with the second lead-out line L2. A second discharge transistor ST2 and a third discharge transistor ST3 of the second ESD unit may be electrically connected with a connection line 81 and electrically connected with a first wiring of a clock signal line 22d through the connection line 81. A first discharge transistor ST1 of a third ESD unit may be electrically connected with the first lead-out line L1 through the third lead-out line, and a fourth discharge transistor ST4 may be electrically connected with the second lead-out line L2. A second discharge transistor ST2 and a third discharge transistor ST3 of the third ESD unit may be electrically connected with a connection line 81 through connection electrodes located on the third conductive layer and the semiconductor layer, and electrically connected with a first wiring of an initial signal line 21d through the connection line 81.

In some examples, the first lead-out line L1 and the second lead-out line L2 may be located on the third conductive layer, and the third lead-out line L3 may be located on the first conductive layer. The connection line 81 may be located on the first conductive layer. The first wiring of the initial signal line 21d and the first wiring of the clock signal line 22d may be located on the third conductive layer. However, this embodiment is not limited thereto.

Figure 17:
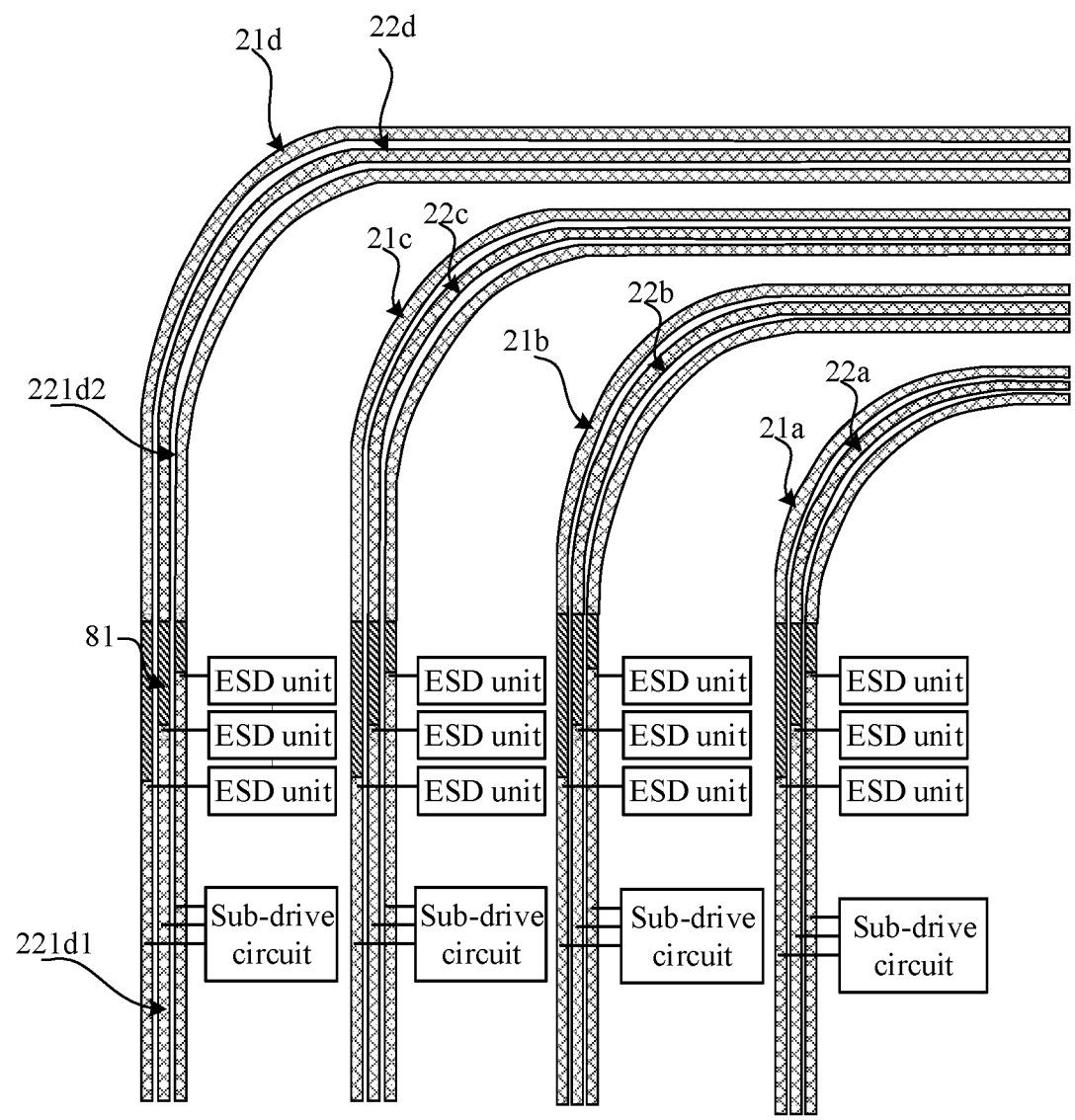
FIG. 17 is another partial schematic diagram of the region A2 in FIG. 1.

FIG. 17 is another partial schematic diagram of the region A2 in FIG. 1. In some exemplary implementation modes, multiple first signal lines (e.g., initial signal lines 21a to 21d and clock signal lines 22a to 22d) of the peripheral region 200 are also connected with an ESD unit to provide an electrostatic discharge path in a working process of the display substrate. One clock signal line 22d is taken as an example for illustration. A first signal line segment 221d1 of a first sub-clock signal line of the clock signal line 22d is electrically connected, and the clock signal line 22d is electrically connected with a second signal line segment 221d2 through a connection line 81. The first signal line segment 221d1 and the second signal line segment 221d2 are of a double-layer wiring structure. Both a section where the first signal line segment 221d1 is connected with the sub-drive circuit and a section where the first signal line segment 221d1 is connected with the ESD unit are of a double-layer wiring.

Rest of the structure of the display substrate according to this embodiment may be referred to descriptions of the aforementioned embodiments, and will not be repeated here.

Figure 18:
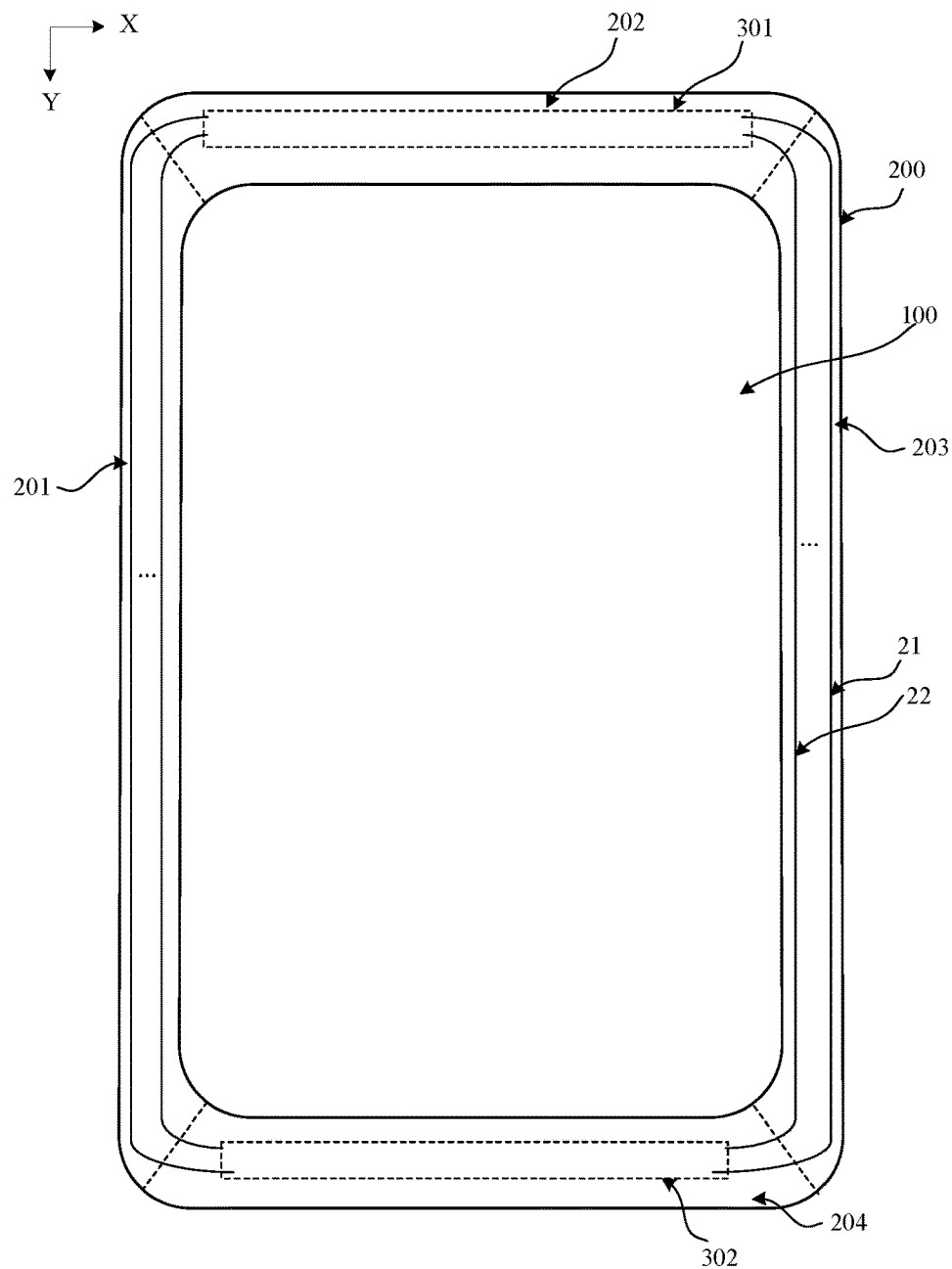
FIG. 18 is another schematic diagram of a display substrate according to at least one embodiment of the present disclosure.

FIG. 18 is another schematic diagram of a display substrate according to at least one embodiment of the present disclosure. In some exemplary implementation modes, as shown in FIG. 18, a length of the display substrate in a first direction X is less than a length of the display substrate in a second direction Y. The peripheral region 200 includes: a first peripheral region 201, a second peripheral region 202, a third peripheral region 203, and a fourth peripheral region 204 which are communicated sequentially. The first peripheral region 201 and the third peripheral region 203 are located on two opposite sides of the display region 100 along the first direction X, and the second peripheral region 202 and the fourth peripheral region 204 are located on two opposite sides of the display region 100 along the second direction Y. The second peripheral region 202 includes a first signal access region 301 and the fourth peripheral region 204 includes a second signal access region 302. Multiple signal access pins are provided in the first signal access region 301, and multiple signal access pins are provided in the second signal access region 302.

In some exemplary implementation modes, as shown in FIG. 18, multiple first signal lines are provided in the peripheral region 200, for example, include multiple initial signal lines 21 and multiple clock signal lines 22. An initial signal line 21 is located in at least one of the first peripheral region 201 and the third peripheral region 203. The initial signal line 21 may extend from the first peripheral region 201 or the third peripheral region 203 to the first signal access region 301 of the second peripheral region 202, be connected with a first driver chip, also extend to the second signal access region 302 of the fourth peripheral region 204, and be connected with a second driver chip. A clock signal line 22 is located in at least one of the first peripheral region 201 and the third peripheral region 203. The clock signal line 22 may extend from the first peripheral region 201 or the third peripheral region 203 to the first signal access region 301 of the second peripheral region 202, be connected with the first driver chip, also extend to the second signal access region 302 of the fourth peripheral region 204, and be connected with the second driver chip. In this example, each first signal line is connected with two driver chips. The each first signal line may be of an integral structure, or sub-signal lines of a first signal line may be connected through a connection line. However, this embodiment is not limited thereto.

In this exemplary implementation mode, clock signal lines connected with different driver chips are set to be integral, so as to ensure that different driver chips output consistent clock signals. Initial signal lines connected with different driver chips are set to be integral, so as to ensure that different driver chips output consistent initial signals. Thus, a case that gate control signals of gate drive circuits on both sides of the display substrate are not synchronized may be improved, so as to improve a display effect.

Rest of structures of the display substrate according to this embodiment and the first signal lines may be referred to descriptions of the aforementioned embodiments, and will not be repeated here.

The structure (or method) shown in this implementation mode may be combined appropriately with a structure (or method) shown in another implementation mode.

Figure 19:
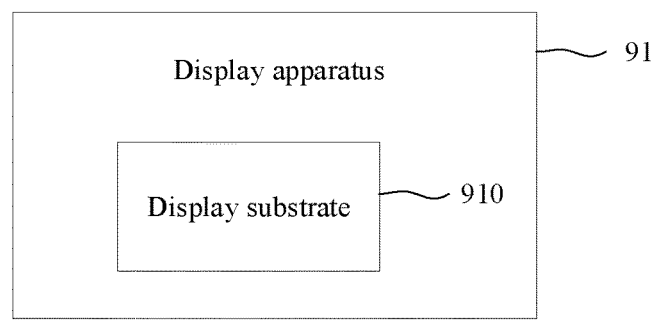
FIG. 19 is a schematic diagram of a display apparatus according to at least one embodiment of the present disclosure.

FIG. 19 is a schematic diagram of a display apparatus according to at least one embodiment of the present disclosure. As shown in FIG. 19, this embodiment provides a display apparatus 91, which includes a display substrate 910 according to the aforementioned embodiments. In some examples, the display substrate 910 may be an OLED display substrate or a QLED display substrate. The display apparatus 91 may be any product or component with a display function, such as a mobile phone, a tablet computer, a television, a display, a notebook computer, a digital photo frame, or a navigator. However, this embodiment is not limited thereto.

The drawings of the present disclosure are only related to structures involved in the present disclosure, and other structures may be referred to usual designs. The embodiments of the present disclosure, i.e., features in the embodiments, may be combined with each other to obtain new embodiments without conflict.

Those of ordinary skill in the art should understand that modifications or equivalent substitutions may be made to the technical solutions of the present disclosure without departing from the spirit and scope of the technical solutions of the present disclosure, and shall all fall within the scope of the claims of the present disclosure.

The invention claimed is:
1. A display substrate, comprising:
a base substrate comprising a display region and a peripheral region located at a periphery of the display region, wherein the peripheral region comprises a first peripheral region, a second peripheral region, a third peripheral region, and a fourth peripheral region which are communicated sequentially; the first peripheral region and the third peripheral region are located on two opposite sides of the display region along a first direction, and the second peripheral region and the fourth peripheral region are located on two opposite sides of the display region along a second direction, the first direction intersecting the second direction;
at least one first signal line located in the peripheral region, wherein the at least one first signal line comprises at least two sub-signal lines connected with each other; at least one sub-signal line of the at least one first signal line is located in the first peripheral region, and another at least one sub-signal line of the at least one first signal line is located in the third peripheral region; and
multiple signal access pins located in a signal access region, wherein the signal access region is located in the fourth peripheral region, or in the fourth peripheral region and the second peripheral region;
wherein each sub-signal line of the at least one first signal line extends to the signal access region and is connected with at least one signal access pin in the signal access region so as to be connected with a driver chip through the at least one signal access pin,
wherein the first peripheral region and the third peripheral region are provided with gate drive circuits connected with the at least one first signal line; and
a gate drive circuit comprises multiple drivers, the multiple drivers are arranged sequentially along a direction away from the display region, and at least one driver comprises multiple cascaded sub-drive circuits.

2. The display substrate according to claim 1, wherein multiple first signal lines are provided in the peripheral region and the multiple first signal lines comprise at least one clock signal line and at least one initial signal line.

3. The display substrate according to claim 2, wherein a line width of the at least one clock signal line is 15 microns to 25 microns, and a line width of the at least one initial signal line is 15 microns to 25 microns.

4. The display substrate according to claim 1, wherein the at least one first signal line is in a shape of an arc in a communicated region of two adjacent peripheral regions.

5. The display substrate according to claim 1, wherein the at least two sub-signal lines of the at least one first signal line are connected with different driver chips.

6. The display substrate according to claim 1, wherein at least one sub-signal line of the at least one first signal line comprises a first wiring and a second wiring connected with each other; the second wiring is located on one side of the first wiring away from the base substrate, and an orthographic projection of the second wiring on the base substrate is overlapped with an orthographic projection of the first wiring on the base substrate.

7. The display substrate according to claim 6, wherein the first wiring is in direct contact with the second wiring; or an insulation layer is disposed between the first wiring and the second wiring, and the second wiring is connected with the first wiring through multiple vias provided on the insulation layer.

8. The display substrate according to claim 1, wherein the at least two sub-signal lines of the at least one first signal line are of an integral structure.

9. The display substrate according to claim 1, further comprising at least one connection line located in the peripheral region;
wherein the two sub-signal lines of the at least one first signal line are connected through the at least one connection line; or at least one sub-signal line of the at least one first signal line comprises at least two signal line segments, and adjacent signal line segments are connected through the at least one connection line;
wherein the at least one connection line is located on one side of the at least one first signal line close to the base substrate.

10. The display substrate according to claim 9, wherein the first peripheral region and the third peripheral region are provided with gate drive circuits; the at least one connection line is located in the second peripheral region, or the first peripheral region and the third peripheral region each comprise at least one first sub-region and at least one second sub-region, both the at least one first sub-region and the at least one second sub-region are adjacent to the display region, the at least one first sub-region and the at least one second sub-region are communicated, a gate drive circuit is located in the at least one first sub-region, and the at least one connection line is located in the at least one second sub-region.

11. The display substrate according to claim 9, wherein an insulation layer is provided between the at least one connection line and the at least one first signal line, and the at least one connection line is connected with the at least one first signal line through a via provided on the insulation layer.

12. The display substrate according to claim 9, wherein in a plane perpendicular to the display substrate, the display substrate comprises a semiconductor layer, a first conductive layer, a second conductive layer, a third conductive layer, and a fourth conductive layer that are disposed on the base substrate; and
The at least one connection line is located on the first conductive layer or the second conductive layer.

13. The display substrate according to claim 9, wherein multiple connection lines are provided in the peripheral region, and lengths of the multiple connection lines are approximately the same, or gradually increase along a direction away from the display region.

14. The display substrate according to claim 1, wherein a sub-drive circuit at least comprises a first output transistor and a second output transistor, and a ratio of width to length of the second output transistor is greater than a ratio of width to length of the first output transistor.

15. The display substrate according to claim 14, wherein a width of a conductive channel of the second output transistor is approximately twice a width of a conductive channel of the first output transistor.

16. The display substrate according to claim 14, wherein the sub-drive circuit is connected with a first power line and a second power line; and the first power line and the second power line are of a single-layer wiring structure.

17. The display substrate according to claim 16, wherein the sub-drive circuit further comprises a first storage capacitor and the first storage capacitor is connected with the first output transistor and the first power line; the first storage capacitor is located between the second power line and the first output transistor.

18. The display substrate according to claim 1, wherein the at least one first signal line is further electrically connected with an electrostatic discharge unit, and at a position where the at least one first signal line is connected with the electrostatic discharge unit, the at least one first signal line is of a single-layer wiring structure or a double-layer wiring structure.

19. A display apparatus, comprising the display substrate according to claim 1.

* * * * *